United States Patent
Ono et al.

(10) Patent No.: US 6,559,463 B2
(45) Date of Patent: *May 6, 2003

(54) MASK PATTERN TRANSFER METHOD, MASK PATTERN TRANSFER APPARATUS USING THE METHOD, AND DEVICE MANUFACTURING METHOD

(75) Inventors: Haruhito Ono, Minamiashigara (JP); Yoshikiyo Yui, Utsunomiya (JP); Masato Muraki, Inagi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/499,297

(22) Filed: Feb. 7, 2000

(65) Prior Publication Data

US 2003/0034460 A1 Feb. 20, 2003

(30) Foreign Application Priority Data

Feb. 9, 1999 (JP) ............................................ 11-031532

(51) Int. Cl.$^7$ .............................. H01J 37/30; G03F 9/00
(52) U.S. Cl. .............................. 250/492.22; 250/492.2; 250/492.23; 250/491.1; 250/398; 250/396 R; 250/400

(58) Field of Search .......................... 250/492.22, 492.2, 250/492.23, 491.1, 398, 396 R, 400

(56) References Cited

U.S. PATENT DOCUMENTS

| | | | |
|---|---|---|---|
| 5,905,267 A | 5/1999 | Muraki | 250/492.22 |
| 5,912,469 A * | 6/1999 | Okino | 250/492.23 |
| 5,981,954 A | 11/1999 | Muraki | 250/397 |
| 6,072,184 A * | 6/2000 | Okino et al. | 250/492.2 |

* cited by examiner

Primary Examiner—Bruce Anderson
Assistant Examiner—Nikita Wells
(74) Attorney, Agent, or Firm—Fitzpatrick, Cella, Harper & Scinto

(57) ABSTRACT

A mask stage speed $|Vm|$, a wafer stage speed $|Vw|$, and an absolute value $|\Delta S|$ of a beam deflection value are determined (step 101). Then, it is judged whether a stripe number is even or odd (step 108) and deflective directions of a mask stage, a wafer stage, and a wafer deflector are set in accordance with the above judgment result (steps 109 and 110). Then, the wafer stage and mask stage respectively start continuous movement (step 113) and divided patterns are exposed (step 115–119). It is judged whether all divided patterns are exposed (step 120). When all divided patterns are not exposed, the next divided pattern is exposed by adding a deflection value on a wafer corresponding to a beam width on a mask (step 121).

18 Claims, 34 Drawing Sheets n : CASE OF ODD NUMBER

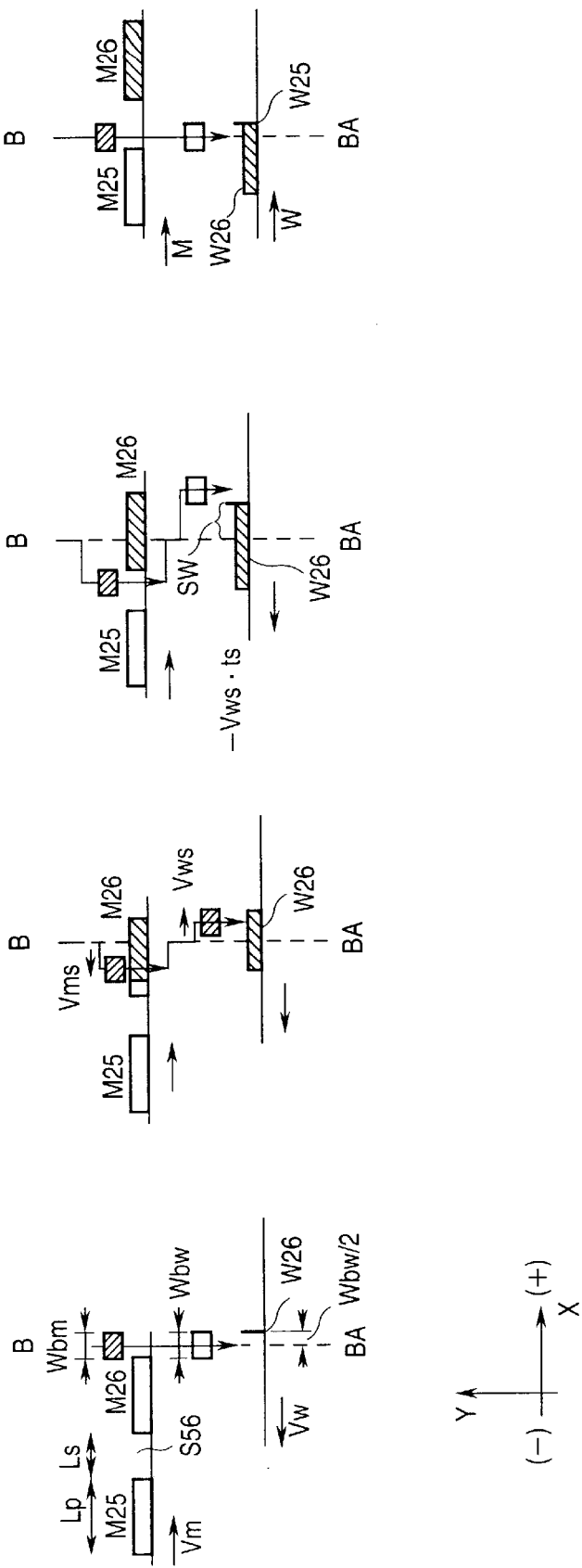

F I G. 20
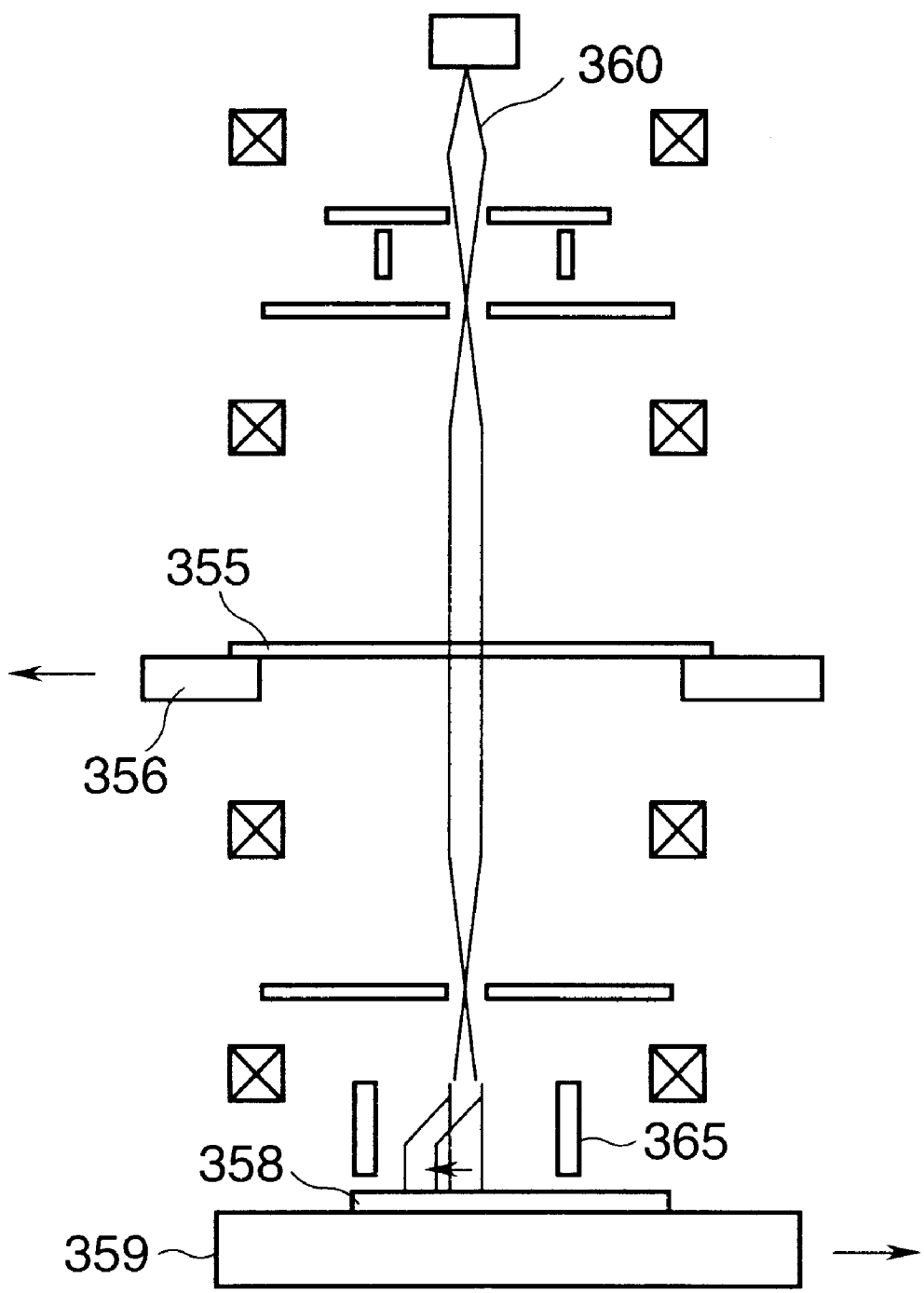

600 CHIP PATTERN

FIG. 30A  FIG. 30B  FIG. 30C
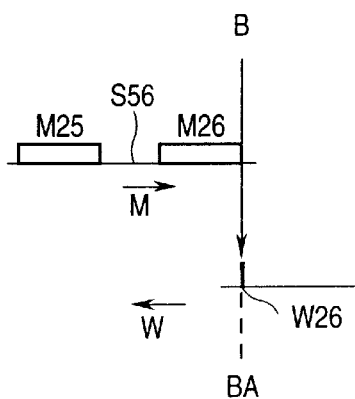
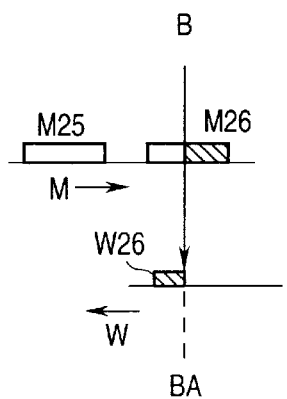
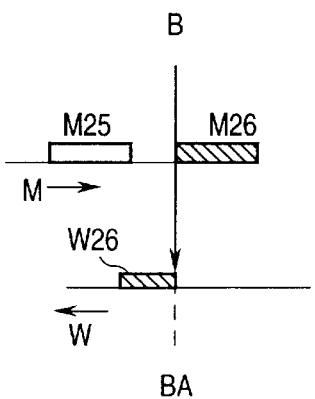
FIG. 30D  FIG. 30E
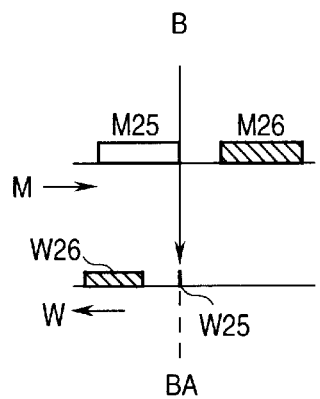
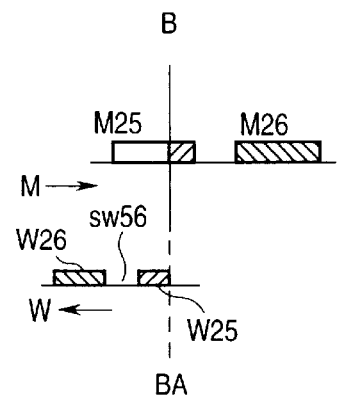

FIG. 31

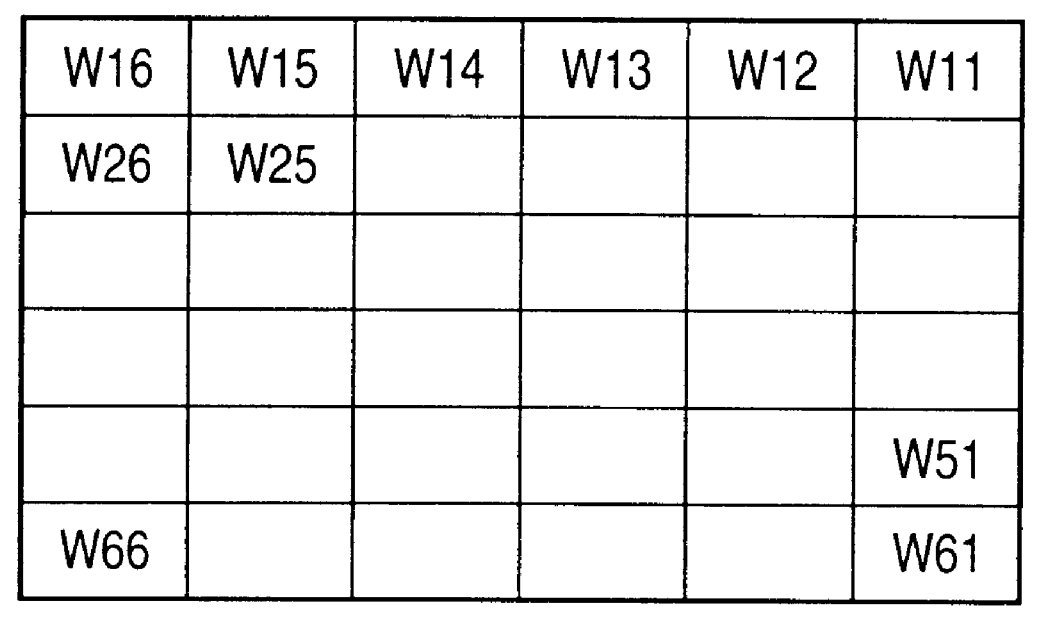

| W16 | W15 | W14 | W13 | W12 | W11 |
|-----|-----|-----|-----|-----|-----|
| W26 | W25 |     |     |     |     |
|     |     |     |     |     |     |
|     |     |     |     |     |     |
|     |     |     |     |     | W51 |
| W66 |     |     |     |     | W61 |

MASK PATTERN TRANSFER METHOD, MASK PATTERN TRANSFER APPARATUS USING THE METHOD, AND DEVICE MANUFACTURING METHOD

BACKGROUND OF THE INVENTION

The present invention relates to charge-beam exposure in lithography for semiconductor device manufacture.

An optical stepper with superior productivity has been used at the mass production stage of semiconductor memory device manufacture. For the production of memory devices from 1 GDRAM and 4 GDRAM downward having a line width of 0.2 µm or less, an electron-beam exposure method having a high resolution and superior in productivity is expected as one of exposure arts suitable for an optical exposure method.

Conventional electron-beam exposure methods mainly use a single-light-beam Gaussian method and a variable forming method. However, because these methods are inferior in productivity, they have been used for such purposes making good use of a superior resolution characteristic of the electron beam as mask drawing, research and development of VLSIs, and exposure of ASIC devices according to small-scale production.

Thus, to apply the electron beam exposure method to mass production, how to improve the productivity is a large problem. In the case of a conventional electron-beam aligner, however, an exposure area of an electronic optical system that can be exposed through one shot is extremely small compared to an exposure area of a projection optical system of an optical aligner. Therefore, to expose a wafer, because electronic and mechanical scanning distances increase compared to those of an optical aligner, a lot of time is required and throughput is extremely lowered. To improve the throughput, it is necessary to greatly accelerate electronic scanning and mechanical scanning or expand an exposure area for one shot.

To improve the throughput while keeping a necessary resolution, a method of forming a circuit pattern to be exposed on a silicon wafer as a mask, applying an electron beam whose exposure area is expanded to the mask, and transferring the mask pattern onto the wafer is studied. An electron-beam mask used for an electron-beam aligner usually has a circuit pattern 2 to 5 times larger than a circuit pattern on a silicon wafer, depending on a projection-system magnification of an electron-beam aligner. For example, it is said that a circuit pattern of one chip of a 4 Gbit-DRAM requires an area of approx. 20 mm×35 mm. A circuit pattern area on a mask for exposing the circuit pattern requires 80 mm×140 mm when a projection-system magnification is ¼. As shown in FIG. 26A, it is difficult to form a chip pattern (thin film portion) 600 having the above size enclosed by a beam portion 601 in a thin-film window on a mask 602 at a high-enough strength and accuracy. Therefore, as schematically shown in FIG. 26B, a structure is used in which the chip pattern 600 is divided into a plurality of portions and a reinforcement beam 603 is set between divided patterns.

FIG. 27A shows a perspective view of an example of the above electron-beam mask and FIG. 27B shows a sectional view of the mask.

A plurality of mask pattern areas 501 are formed on a mask substrate 502 fixed onto a mask stage 506 and a portion between mask pattern areas 501 is reinforced by a reinforcement beam 505.

The mask pattern area 501 is formed by patterning an electron-beam scatterer (high scatterer) 504 having a W of 0.02 µm on an electron-beam passing film (low scatterer) 503 (FIG. 27B) serving as a membrane made of SiN having a thickness of 0.15 µgm formed on the mask substrate 502 of a silicon wafer having a thickness of, for example, 2 mm. Because it is difficult to handle the silicon wafer alone, it is fixed to a mask stage 506 used for X-ray exposure.

FIG. 28 shows an example of a conventional transfer system for transferring divided mask patterns.

An electron beam 510 emitted from an electron source 501 is converged by a first condenser lens 511 and shaped into a rectangular electron beam by a forming aperture 502. The shaped electron beam 510 is formed into an almost parallel electron beam by a second condenser lens 512 and applied to a mask 505. The mask 505 is mounted on a mask stage 506 and continuously moved together with the mask stage 506 (this movement direction is assumed to be the x direction). The electron beam 510 passing through the mask 505 is contracted and transferred to a wafer 508 mounted on a wafer stage 509 continuously moving in the opposite direction to the mask stage 506 by a first projection lens 513 and a second projection lens 514.

FIG. 29 shows how divided chip patterns on the mask 505 are transferred onto the wafer 508.

The mask stage 506 moves from the electron beam 510 stopping under exposure along an arrow E shown at the top right in FIG. 29. A group of divided chip patterns on the mask 505 to which the electron beam 510 is applied due to one-time movement of the mask stage 506 in the X direction is referred to as a divided chip pattern on a stripe. For example, divided chip patterns M11, M12, ..., and M16 are present on the same stripe.

Moreover, the mask stage 506 and wafer stage 509 move synchronously each other. The wafer stage 509 is moved along an arrow F at the bottom right in FIG. 29. Furthermore, patterns between stripes are connected so that beams between stripes on the mask 505 do not appear on contracted patterns on the wafer stage 508 by moving the mask stage 506 and wafer stage 509 to the first pattern of each stripe. Patterns M11, M12 . . . on the mask 505 are contracted on the wafer 508 and transferred as W11, W12 . . . .

FIGS. 30A to 30E show states of transferring a divided pattern M26 and a divided pattern M25 on the mask 505 having a beam width S56 in FIG. 29.

In FIGS. 30A to 30E, symbol B denotes a light beam, BA denotes a light-beam optical axis, an arrow M denotes a moving direction of a mask, and an arrow denotes a moving direction of a wafer, and the arrow M and arrow W show directions opposite to each other.

Exposure of the divided pattern M26 onto the wafer 508 is started (FIG. 30A) and the divided pattern M26 is exposed onto the wafer 508 as a divided pattern W26 to be transferred in accordance with the relative movement between the mask 505 and the wafer 508 (FIG. 30B) When every divided pattern M26 is exposed on the wafer 508 as the divided pattern W26 to be transferred, exposure of the divided pattern M26 is completed (FIG. 30C). Then, exposure of the divided pattern M25 onto the wafer 508 is started as a divided pattern W25 to be transferred (FIG. 30D) and exposure of the next divided pattern M25 is exposed similarly to the exposure of the divided pattern M26 (FIG. 30E).

However, the above transfer method has the following problem.

That is, as clarified from the description about the illustration of the chip 3 on the wafer 508 in FIG. 29 and FIGS. 30A to 30E, beams shown by s12, s23, s34, s45, and s56 in FIG. 29 present between divided patterns on the same stripe on the mask 505 are left on the wafer 508 as gaps shown by SW12, SW23, SW34, SW45, and SW56, all divided patterns are connected, and thereby a transferred pattern shown in FIG. 31 necessary for a chip pattern circuit to normally operate cannot be realized.

To solve the above problem, a method of repeatedly stopping and moving a wafer stage depending on a light-beam position on a mask while continuously moving a mask stage is considered. This is a method of moving a wafer stage when a light beam is present on a divided pattern on a mask on the same stripe but stopping the wafer stage when the light beam is present on a beam portion between divided patterns to remove the gaps s12, s23, s34, s45, and s56 from a wafer. According to the above method, it may be possible to connect divided patterns on a wafer as shown in FIG. 31. However, it is very difficult to practically use the above method because in the case of the mechanical connection control, a pattern connection accuracy is lowered due to vibration generated when a stage is accelerated or decelerated or deterioration of a pattern connection accuracy arises due to a low mechanical control response speed.

SUMMARY OF THE INVENTION

Therefore, it is an object of the present invention to provide a mask pattern transfer method for accurately connecting divided patterns on a mask on a wafer, a mask pattern transfer apparatus using the mask pattern transfer method, and a device manufacturing method.

To attain the above object, the present invention uses a mask pattern transfer method for transferring a desired pattern onto an object with a charged beam by using a mask on which divided patterns obtained by dividing the desired pattern are arranged, comprising:

a step of continuously moving the object and the mask relative to the charged beam in a direction along which a first divided pattern and a second divided pattern adjacent to the first divided pattern are arranged; and a step of deflecting the charged beam passed through the mask so that a first exposure area in which the first divided pattern is exposed and a second exposure area in which the second divided pattern is exposed are connected to each other.

As described above, in the case of a mask pattern transfer method of the present invention, a mask and an object continuously and relatively move, thereby vibration due to acceleration/deceleration of the mask and object or a low mechanical control response speed is removed, and thus a pattern connection accuracy is not lowered.

Moreover, because deflection of a charged beam passing through divided patterns is set, a desired pattern is obtained by setting the deflection for connecting divided patterns on a mask arranged at both sides of a beam on an object.

In the case of a mask pattern method of the present invention, it is permitted that a deflection value of a charged beam passing through divided patterns is not accumulated. In this case, because an error about a position is prevented from occurring at the time that exposure is successively performed, the method is preferable at the time of exposing a pattern to be divided into many sub-patterns.

The present invention also provides mask pattern transfer apparatus for transferring a desired pattern onto an object with a charged beam by using a mask on which divided patterns obtained by dividing the desired pattern are arranged, the apparatus comprising:

a beam generator which generates the charged beam toward the mask;

a movable mask stage on which the mask is mounted;

a movable object stage on which the object is mounted;

a first deflector which continuously deflects the charged beam passed through the mask; and a controller for continuously moving the mask stage and the object stage from a start of exposure of a first exposure area in which a first divided pattern is exposed up to an end of exposure of a second exposure area in which a second divided pattern is exposed, and after exposing the first exposure area, making the first deflector deflect the charged beam in a continuous moving direction of the object.

A device manufacturing method of the present invention includes the step of transferring a mask pattern by using the above mask pattern transfer method.

A device manufacturing method of the present invention includes the step of transferring a mask pattern by using the above mask pattern transfer apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and configure a part of the specification, illustrate embodiments of the invention, and together with the description, serve to explain the principles of the invention.

FIGS. 12A to 12D are illustrations showing states in which divided patterns on a mask are connected on a wafer when considering a light-beam width in the second embodiment of the present invention;

FIG. 20 is a schematic block diagram of a mask pattern transfer apparatus of a fourth embodiment of the present invention;

FIGS. 30A to 30E are illustrations showing conventional states in which divided patterns on a mask are connected on a wafer; and FIG. 31 is an illustration for explaining the connection between divided patterns to be realized on a wafer.

DETAILED DESCRIPTION OF THE INVENTION

Preferred embodiments of the present invention will be described in detail in accordance with the accompanying drawings.

(First Embodiment)

Figure 1:
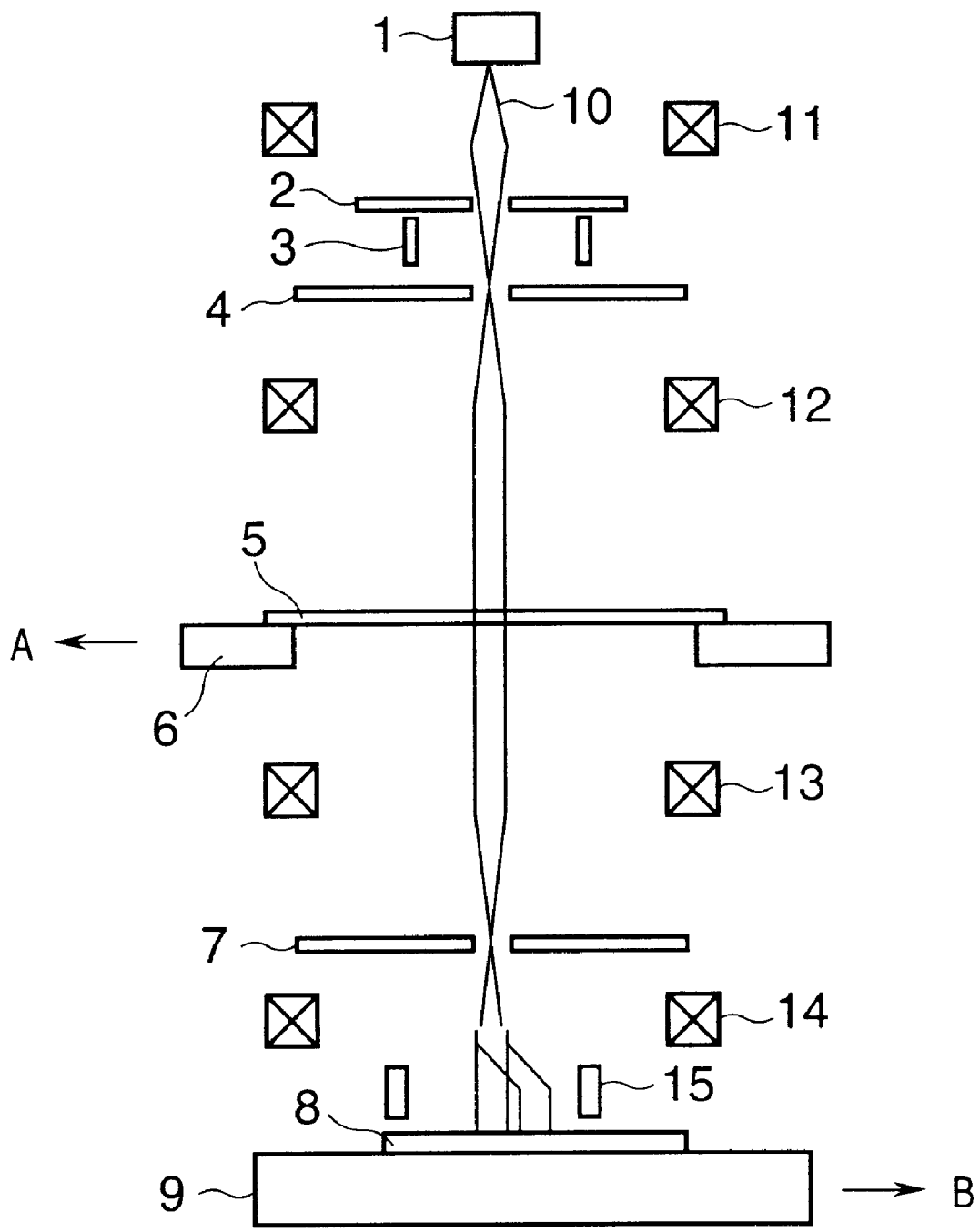
FIG. 1 is a schematic block diagram of a mask pattern transfer apparatus of a first embodiment of the present invention.

FIG. 1 shows a schematic diagram of the mask pattern transfer apparatus of a first embodiment of the present invention.

In the case of a mask pattern transfer apparatus of the present invention, an electron beam 10 emitted from an electron source 1 irradiates a mask 5 having divided patterns on a mask stage 6 after passing through a first condenser lens 11, a forming aperture 2, a blanker 3, a blanking aperture 4, and a second condenser lens 12 and moreover, the electron beam 10 is applied to a wafer 8 on a wafer stage 9 after passing through a first projection lens 13, a scattered-electron limiting aperture 7, a second projection lens 14, and a wafer deflector 15 to connect divided patterns of the mask 5 and transfer the patterns to the wafer 8.

The electron beam 10 emitted from the electron source 1 is converged by the first condenser lens 11 and formed into a rectangular electron beam by the forming aperture 2. The formed electron beam 10 is changed to an almost-parallel electron beam by the second condenser lens 12 and applied to the mask 5. In this case, it is possible to control whether to make the electron beam 10 reach the mask 5 after passing through the blanking aperture 4 (light-beam-on state) or not to make the electron beam 10 reach the mask by preventing the electron beam 10 from passing through the blanking aperture 4 (light-beam-off state) in accordance with a signal to be supplied to the blanker 3. That is, applying means for applying the electron beam 10 serving as a charged beam to the mask 5 is configured of the electron source 1, forming aperture 2, blanker 3, blanking aperture 4, first condenser lens 11, and second condenser lens 12. The applying means for applying the electron beam 10 to the mask 5 makes it possible to turn on/off the electron beam.

The mask 5 is held on the mask stage 6 to be continuously moved. It is assumed that the stage 6 is moved along the X-axis (refer to FIG. 3 to be mentioned later). The electron beam 10 applied to the mask 5 is contracted and transferred to the wafer 8 on the wafer stage 9 continuously moving in the direction shown by an arrow B opposite-direction to the mask stage 6 shown by an arrow A by the first projection lens 13 and the second projection lens 14. In this case, deflection up to a value equivalent to a beam width which is equal to the interval between divided patterns on the mask 5 is executed in the continuous moving direction of the wafer stage 9 by the wafer deflector 15 serving as first deflecting means.

Then, a control block of the mask pattern transfer apparatus shown in FIG. 1 is described below by referring to the control block diagram of this embodiment shown in FIG. 2.

A control system 21 is configured by a blanker control circuit 22 for controlling a blanker 3, a mask-stage-driving control circuit 23 for controlling the driving of a mask stage 6, a mask-stage laser interferometer 24 for detecting a position of the mask stage 6, a wafer-stage-driving control 25 for controlling the driving of a wafer stage 9, a wafer-stage laser interferometer 26 for detecting a position of the wafer stage 9, a deflection control circuit 27 for controlling deflection of an electron beam 10, a deflecting-position correction circuit 28, and an optical-characteristic control and correction circuit 29 for controlling the optical system such as lenses.

The blanker control circuit 22 controls signals to be supplied to the blanker 3 and turns on/off a charged beam. When the charged beam is turned off, the electron beam 10 cannot reach the mask 5 or wafer 8 because it is interrupted by the blanking aperture 4.

The mask-stage-driving control circuit 23 controls driving of the mask stage 6 in accordance with the mask stage information supplied from the mask-stage laser interferometer 24.

The wafer-stage-driving control circuit 25 controls driving of the wafer stage 9 in accordance with the wafer stage information supplied from the wafer-stage laser interferometer 26.

The deflection control circuit 27 controls the wafer deflector 15 for deflecting a light beam on the wafer 8 together with the deflecting-position correction circuit 28 correcting a position of the light beam due to a positional error of the stage.

The optical-characteristic control and correction circuit 29 controls not only the electron source 1 and various lenses such as the first condenser lens 11, second condenser lens 12, first projection lens 13, and second projection lens 14 but also various correction lenses not illustrated in FIG. 1 and controls and corrects optical characteristics of the system.

The control system 21 transfers information to and from a CPU 31 through an interface 30 and moreover transfers information to and from control circuits and correction circuits. A memory 32 is set between the CPU 31 and the control system 21 and the information in the memory 32 can be shared by the CPU31 and the control system 21. Moreover, the CPU 31 can transfer information to and from a network out of the apparatus through the interface 30.

Figure 3:
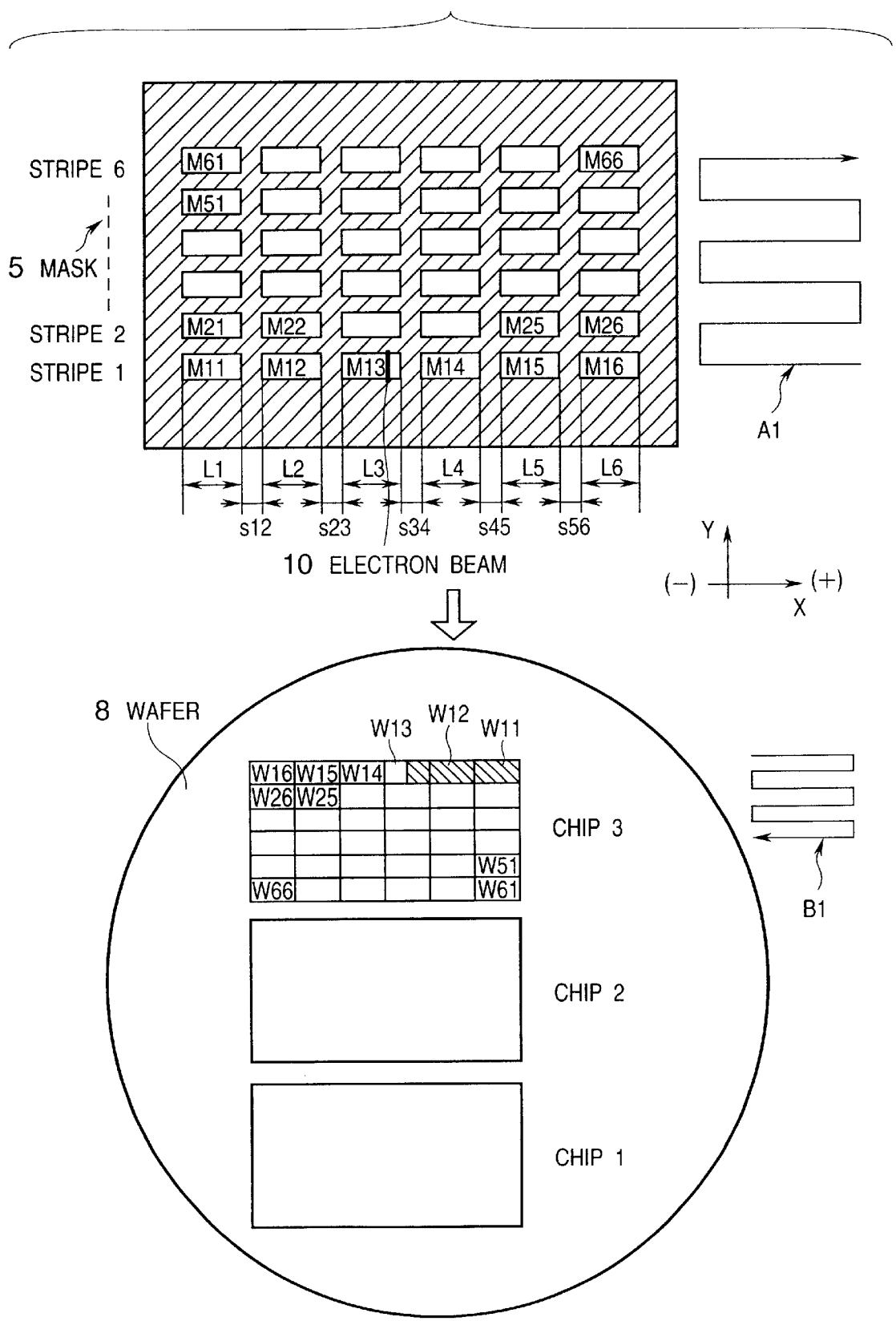
FIG. 3 is an illustration showing an arrangement state of divided patterns on a mask and a transfer state of divided patterns to a wafer by an electron beam.

FIG. 3 shows an arrangement state of divided patterns on the mask 5 and a transfer state of the divided patterns to the wafer 8 by the electron beam 10.

Divided patterns M11 to M66 are arranged on the mask 5 like a 6×6 matrix. The divided patterns M11 to M61, M12 to M62, M13 to M63, M14 to M64, M15 to M65, and M16 to M66 arranged in the Y-axis direction have X-directional lengths L1, L2, L3, L4, L5, and L6 and beam widths between divided patterns in the X-axis direction are s12, s23, s34, s45, and s56. Moreover, the divided patterns M11 to M16 arranged in the X-axis direction configure a stripe 1, the divided patterns M21 to M26 configure a stripe 2, the divided patterns M31 to M36 configure a stripe 3, the divided patterns M41 to M46 configure a stripe 4, the divided patterns M51 to M56 configure a stripe 5, and the divided patterns M61 to M66 configure a stripe 6.

Then, the outline of transfer of the divided patterns M11 to M66 on the mask 5 to the wafer 8 will be described below.

The mask stage 6 is moved from the electron beam 10 which stops under exposure along an arrow Al shown at the right side of the mask 5 and the wafer stage 9 is moved synchronously with the movement of the mask stage 6 along an arrow B1 shown at the right side of the wafer 8.

Divided patterns are connected on the wafer 8 by deflecting the electron beam 10 in the direction the same as the continuous moving direction of the wafer stage 9 by the wafer deflector 15 in FIG. 1 so that a beam between divided patterns on the same stripe does not appear on a contracted pattern on the wafer 8. Moreover, divided patterns on different stripes are connected up to the first divided pattern of each stripe, that is, by moving the mask stage 6 and the wafer stage 9 in the Y-direction so that a beam between stripes on the mask 5 does not appear on a contracted pattern on the wafer 8. The divided patterns M11, M12, . . . , and M66 on the mask 5 are contracted on the wafer 8 and connected as W11 and W12, . . . , and W66 of the chip 3. Similarly, chips 1 and 2 on the wafer 8 are transferred.

In the case of this embodiment, the mask stage 6 and wafer stage 9 are moved along the X-axis and the rightward direction on the paper surface is assumed as the positive direction of the X-axis and is shown as (+) and the leftward direction on the paper surface is assumed as the negative direction of the X-axis and is shown as (−).

FIGS. 4A to 4E show states in which the divided pattern M26 serving as a first divided pattern and the divided pattern M25 serving as a second divided pattern on the mask having the beam width s56 shown in FIG. 3 are connected on the wafer 8.

In FIGS. 4A to 4E, a trace of the electron beam 10 is shown by an arrow B, a light-beam optical axis is shown by BA, a moving direction of the mask 5 is shown by an arrow M, and a moving direction of the wafer 8 is shown by an arrow W and the direction of the arrow M is opposite to that of the arrow W.

Figures 4A, 4B, 4C:
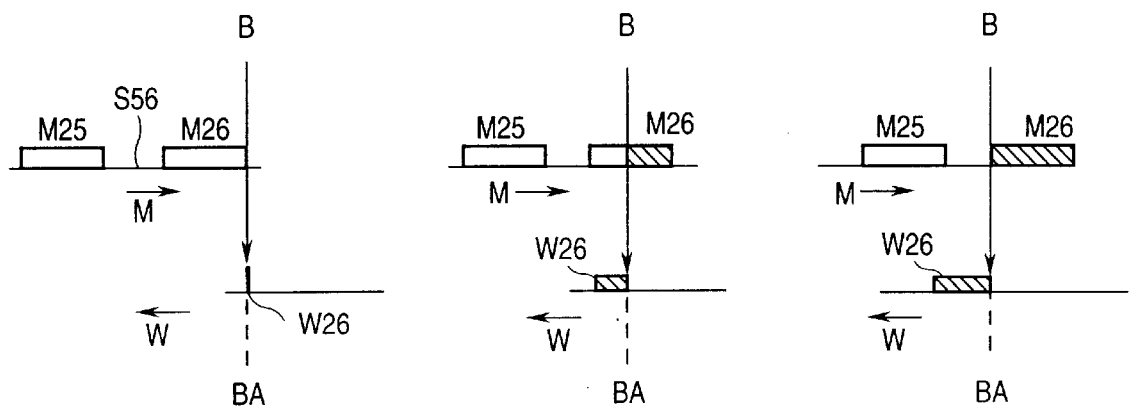
FIGS. 4A to 4E are illustrations showing a state in which divided patterns on a mask of the first embodiment of the present invention are connected on a wafer.

The exposure of the divided pattern M26 onto the wafer 8 is started (FIG. 4A) and the divided pattern M26 is exposed onto the wafer 8 as the divided pattern W26 to be transferred in accordance with the relative movement between the mask 5 and the wafer 8 (FIG. 4B). When every divided pattern M26 is exposed onto the wafer 8 as the divided pattern W26 to be transferred, the exposure of the divided patterns M26 is completed (FIG. 4C).

Figures 4D, 4E:
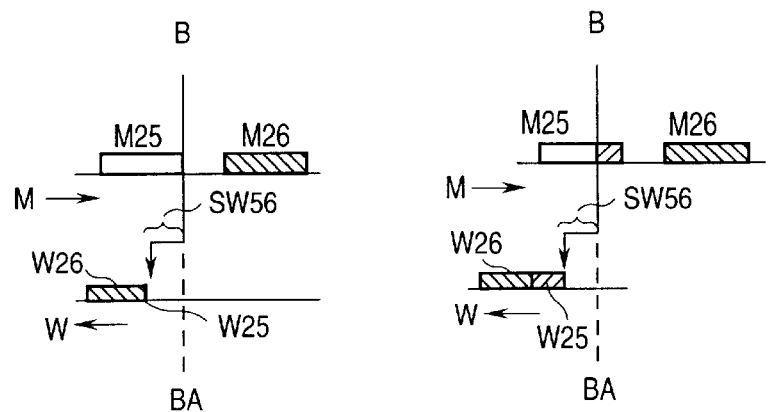

Then, exposure of the next divided pattern M25 is started as a divided pattern W25 to be transferred on the wafer 8 (FIG. 4D) and the divided pattern M25 on the mask 8 is connected to the divided pattern W26 to be transferred as the divided pattern W25 to be transferred and the divided pattern W25 to be transferred is exposed (FIG. 4E).

FIG. 4D shows that the divided pattern M26 on the mask 5 is already exposed as the divided pattern W26 to be transferred and thereafter, the divided pattern M25 on the mask 8 skips the beam width s56 on the mask and how the divided pattern M25 is connected as the divided pattern W25 to be transferred serving as the next second exposure area. That is, in FIG. 4D, the electron beam 10 is deflected by a certain fixed distance SW56 corresponding to the beam width s56 on the mask 5 at the wafer 8 side. Because of the above deflection, the beam s56 on the mask 5 is not exposed to the wafer 8 as shown in FIG. 4E but the divided pattern W26 to be transferred and the divided pattern W25 to be transferred are connected.

In this case, a light-beam deflection value is proportional to a current for exciting a coil when the wafer deflector 15 in FIG. 1 uses, for example, an electromagnetic deflector.

Figure 5:
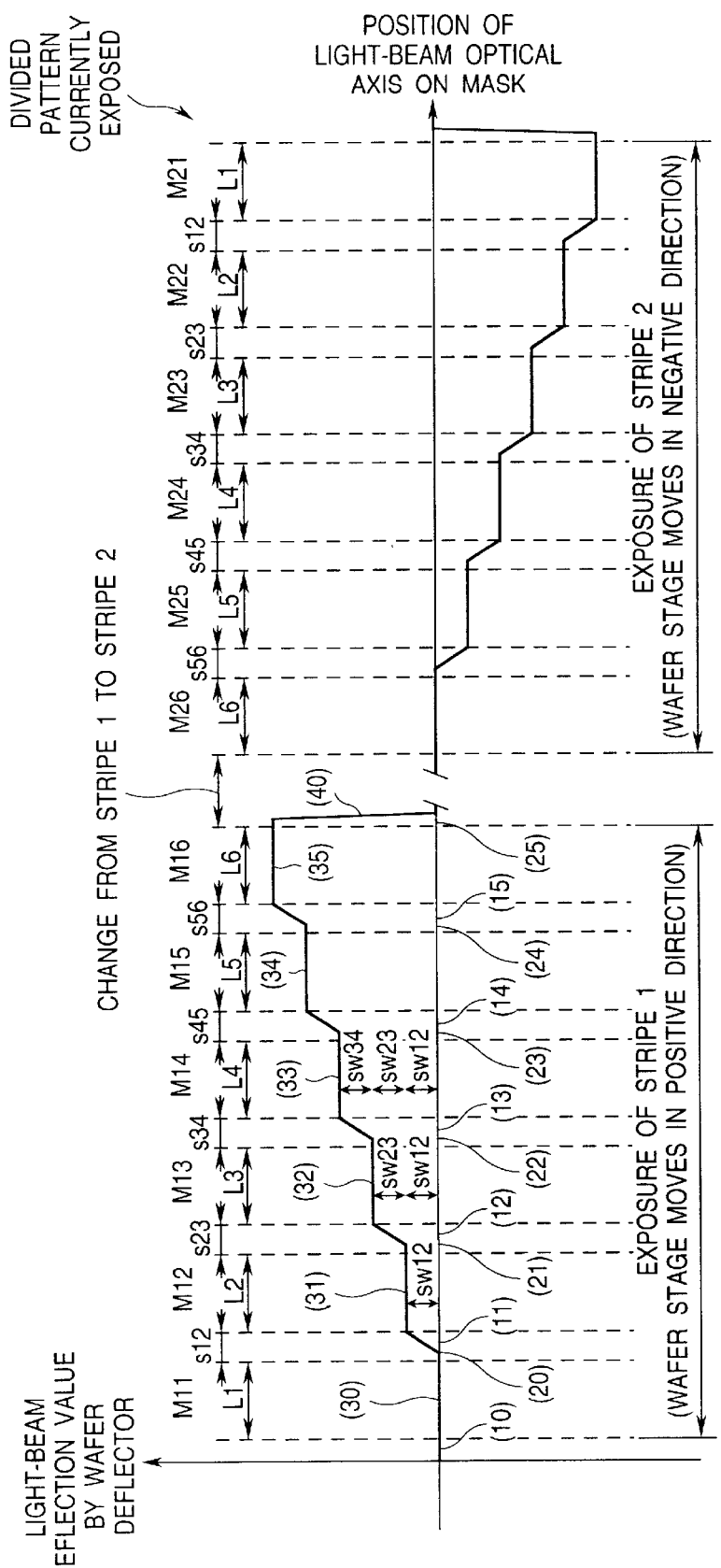
FIG. 5 is an illustration showing the relation between a light-beam deflection value by a wafer deflector and a position of a light-beam optical axis on a mask of the first embodiment of the present invention.

FIG. 5 shows the relation between a light-beam deflection value by the wafer deflector 15 and a position of a light-beam optical axis on the mask 5.

The X-axis denotes a position of the light-beam optical axis on the mask 5 and the light-beam optical axis also can be regarded as a time base.

By stepwise accumulating and increasing a light-beam deflection value generated by the wafer deflector 15 by a distance on the wafer 8 corresponding to beam widths in the same stripe shown by s12, s23, s34, s45, and s56 in FIG. 3, it is possible to connect divided patterns on the same stripe on the wafer 8.

Figure 6A:
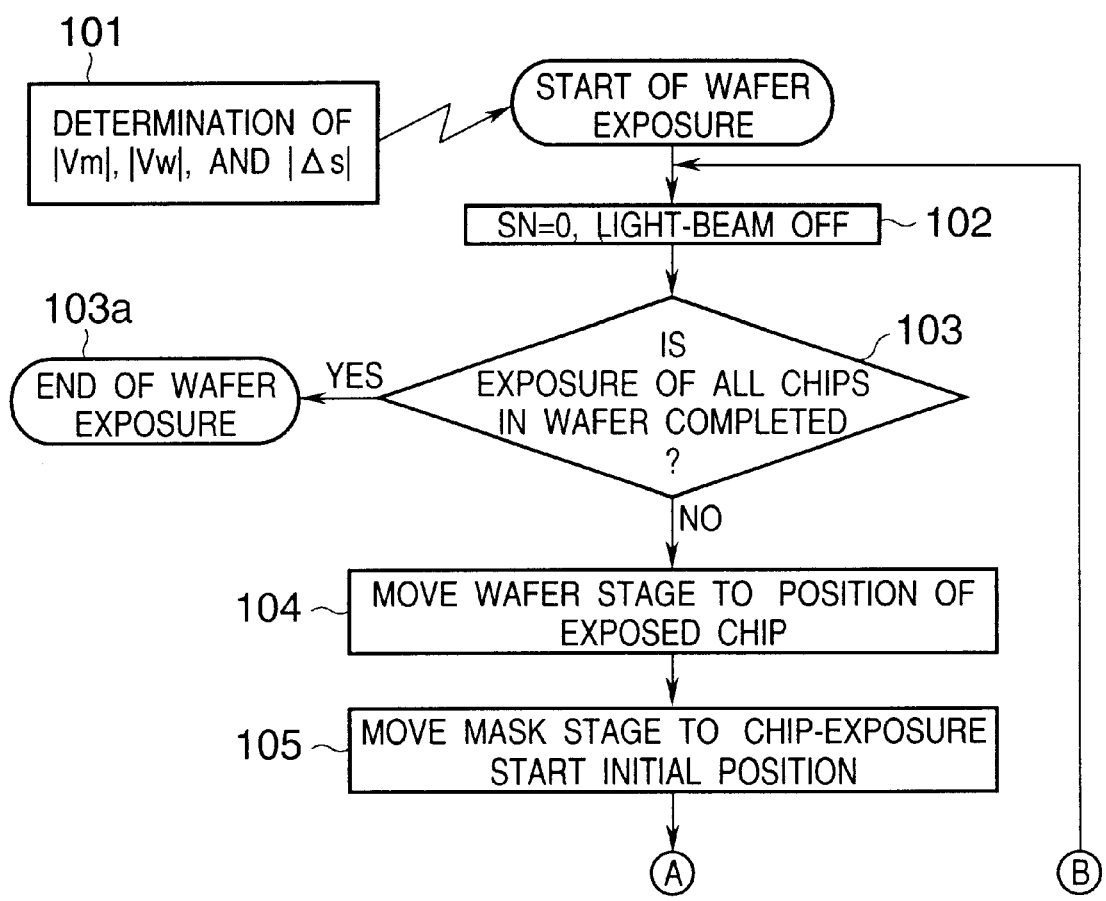
FIGS. 6A and 6B are flow charts for wafer exposure of the first embodiment of the present invention.
Figure 6B:
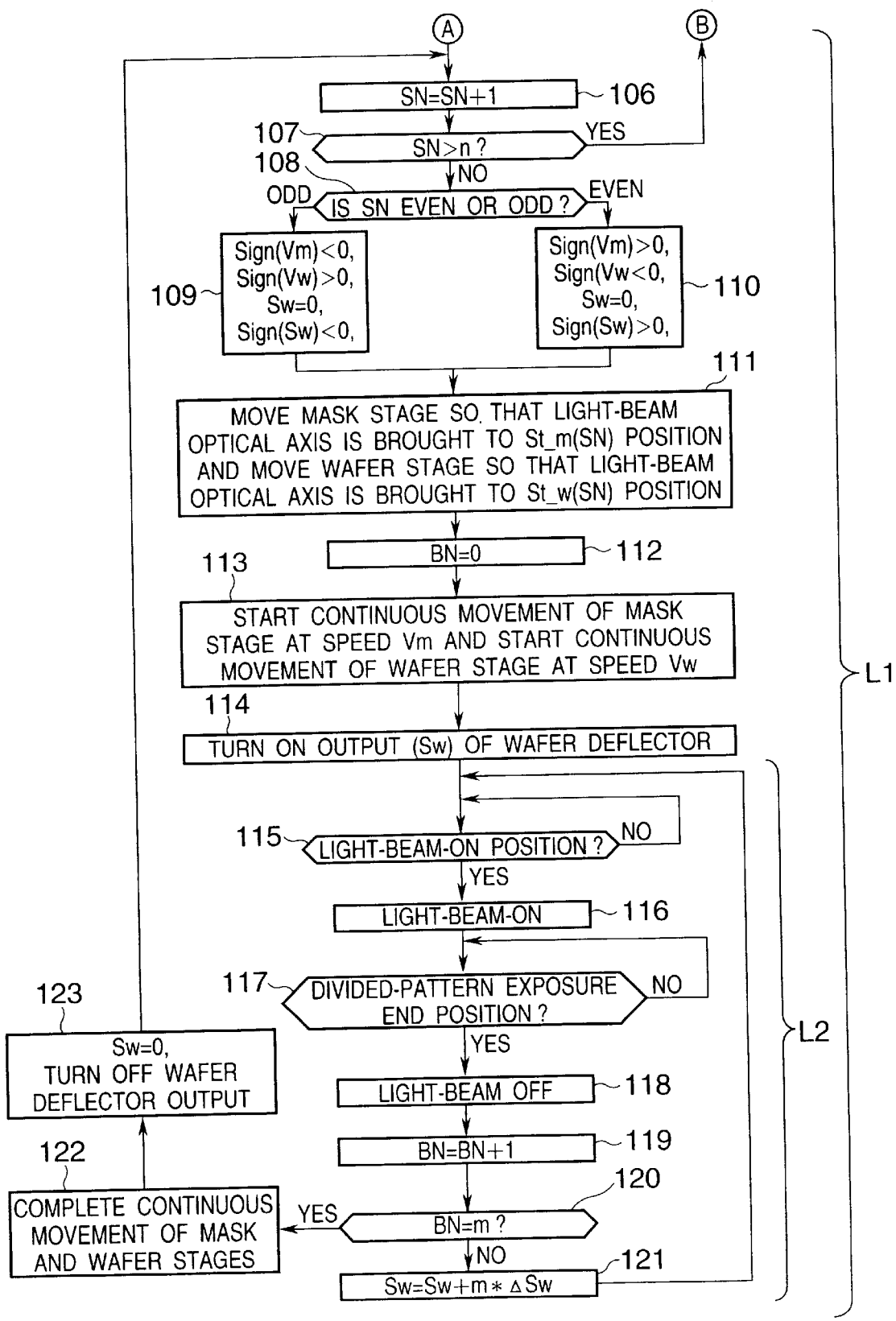
Figure 7A:
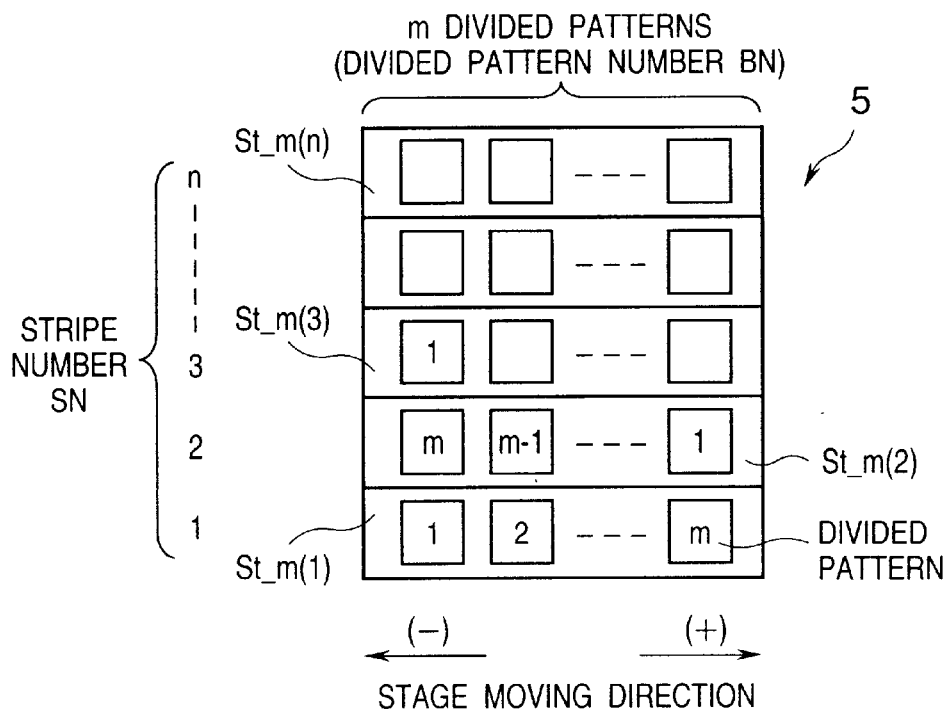
FIGS. 7A and 7B are illustrations showing states in which divided patterns are arranged on a mask and the divided patterns on the mask are transferred onto and arranged on a wafer through exposure.
Figure 7B:
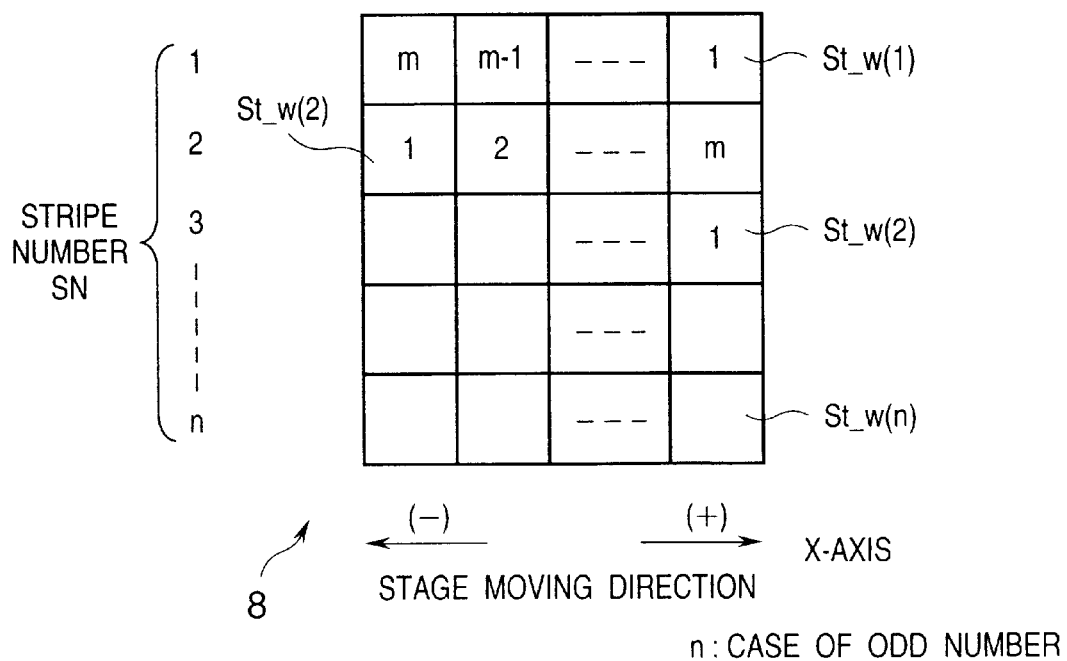

FIGS. 6A and 6B show flow charts for wafer exposure in this embodiment, FIG. 7A shows a divided pattern arrangement for forming a chip pattern on the mask 5, and FIG. 7B shows a state in which divided patterns on the mask 5 are transferred and arranged onto the wafer 8 through exposure. The flow shown in FIGS. 6A and 6B is described below by referring to FIGS. 7A and 7B.

A divided pattern having a divided-pattern number BN on a stripe number SN on the mask 5 shown in FIG. 7A is transferred as an exposed pattern shown by a division number BN on a stripe number SN on the wafer 8 shown in FIG. 7B. For example, St_m(1) on the mask 5 in FIG. 7A is transferred to St_w(1) on the wafer 8 in FIG. 7B, St_m(2) is transferred to St_w(2), . . . , and St_m(SN) is transferred to St_w(SN).

Moreover, it is assumed that the number of stripes is n and the number of divided patterns on a stripe is m and St_m (SN) in FIG. 7A shows an initial position of the mask stage 6 when starting the exposure of a stripe having a stripe number SN. The mask stage 6 is moved so that the light-beam optical axis shown by BA in FIG. 4 is brought to the initial position.

Similarly, St_w(SN) in FIG. 7B shows an initial position of the wafer stage 9 when a divided pattern on a stripe having a stripe number SN is transferred onto the wafer 8. When exposure of a pattern on a new stripe is started, the wafer stage 9 is moved so that the light-beam optical axis shown by BA in FIG. 4 is brought to the initial position.

Then, symbols used in FIGS. 6A and 6B will be described below.

Symbol ΔSw denotes a light-beam deflection value corresponding to a beam width between divided patterns on the mask 5 above the wafer 8, Sw denotes a light-beam deflection value above the wafer 8, sign(Sw) denotes a direction of a light-beam deflection value above the wafer 8 {in this case, it is assumed that deflection in the positive direction (+) is positive (>0) and deflection in the negative direction (−) is negative (<0) similarly to the stage moving direction in FIGS. 7A and 7B}, Vm denotes a mask-stage speed, sign(Vm) denotes a mask-stage moving direction {in this case, decision of positive and negative is the same as the case of sign(Sw)}, Vw denotes a wafer-stage speed, and sign(Vw) denotes a wafer-stage moving direction {in this case, decision of positive and negative is the same as the case of sign(Sw)}.

Vm, Vw, and Sw respectively include a direction. When the direction is positive, it shows positive directional movement on the X-axis. When the direction is negative, it shows negative-directional movement on the X-axis.

Steps in the flow chart shown in FIGS. 6A and 6B will be described below.

The following are determined: mask-stage speed |Vm|, wafer-stage speed |Vw|, and absolute value |ΔS| of a light-beam deflection value corresponding to the beam width between divided patterns on the mask 5 above the wafer 8 (step 101).

When it is assumed that a current value of an electron beam above the wafer 8 is I, a length of an electron beam 10 on the wafer 8 is Lby, a sensitivity of a resist to be used is S, and an optical magnification is 1/M, the following expressions (1) and (2) are effected.

$$|Vw|=I/(Lby \cdot S) \quad (1)$$

$$M \cdot |Vs|=|Vm| \quad (2)$$

The mask-stage speed |Vm| and wafer-stage speed |Vw| are determined in accordance with expressions (1) and (2). Moreover, when assuming that a beam width on the mask 5 is equal to s56, a distance SW56 corresponding to s56 on the wafer 8 is obtained as SW56=S56/M. In this case, |ΔS|=s56/M is effected. To determine these values, it is permitted to store results computed by a computer out of an apparatus in a memory of the apparatus via a network or compute values by a computer of the apparatus.

When |Vm|, |Vw|, and |ΔS| are determined, exposure is started in accordance with the computed values obtained in step 101.

First, when a stripe number SN is equal to 0, the electron beam 10 is kept turned-off (step 102). Then, it is judged whether exposure of every chip to be exposed in the wafer 8 is completed (step 103). When exposure of every chip is completed, exposure of the wafer 8 is completed (step 103a). However, if exposure of every chip is not completed, the next step is started to expose the next chip.

The wafer stage 9 is moved to a position where a chip pattern is exposed on the wafer 8 (step 104). This position is a position where the central position of an exposed chip pattern coincides with a light-beam optical axis.

Then, the mask stage 6 is moved to a chip-start initial position (step 105). This position is a position where the vicinity of St_m(1) in FIG. 7A becomes a light-beam optical axis.

A loop L shows a loop for exposing a certain chip pattern on the wafer 8.

First, it is judged whether every stripe pattern necessary for forming a chip pattern is exposed (steps 106 and 107).

Then, it is judged whether a stripe number is even or odd (step 108).

When the stripe number is odd, the moving direction of the mask stage 6 is set to the negative direction of the X-axis, the moving direction of the wafer stage 9 is set to the positive direction of the X-axis, a deflecting value by the wafer deflector 15 is reset to 0, and a deflecting direction by the wafer deflector 15 is set to the positive direction of the X-axis (step 109).

When the stripe number is even, the setting in step 109 is reversed (step 110).

Then, the mask stage 6 is moved so that a light-beam optical axis is brought to the position of St_m (SN) on the mask 5 and the wafer stage 9 is moved so that a light-beam optical axis is brought to the position of St_w (SN) on the wafer 8 (step 111). Thereby, the mask 5 and wafer 8 are located at a one-stripe exposure start position.

Then, a divided pattern number BN on a stripe is reset to 0 (step 112).

Then, the mask stage 6 is continuously moved at a speed of |Vm| and the wafer stage 8 is continuously moved at a speed of |Vw| in the direction set in step 109 or 110 (step 113).

Then, as shown by (30) in FIG. 5, a wafer-deflector output that is initially equal to 0 is turned on (step 114). As described later, the wafer-deflector output is stepwise accumulated for each divided pattern in step 121 as shown by (30) to (35) in FIG. 5 and when the exposure for one stripe is completed, the output is reset to 0 in step 123 as shown by (40) in FIG. 5.

A loop L2 shows a loop for exposing all of m divided patterns present on a stripe and completing the exposure for one stripe.

First, it is judged whether the current position is a position for turning on the electron beam 10 in order to expose divided patterns (step 115) and the electron beam 10 is turned on after divided patterns are moved (step 116). The position is located slightly forward than a divided-pattern exposure start position in the moving direction of the mask 5 and set so that the divided-pattern exposure start position reaches a light-beam optical axis after a settling time of the electron beam 10 expires. The position corresponds to each of the positions shown by (10) to (15) in FIG. 5.

Then, it is judged whether the mask reaches a divided-pattern exposure end position serving as the other end of divided patterns (step 117). When the mask reaches the end position, the electron beam 10 is turned off (step 118) to increase divided-pattern number BN by 1 (step 119). This position is one of the positions shown by (20) to (25) in FIG. 5.

Then, it is judged whether all of m divided patterns on one stripe are exposed (step 120). Unless all of m divided patterns are exposed, a deflection value (SW12 or SW12+SW23 as shown in FIG. 5) on the wafer 8 corresponding to a beam width on the mask 5 is added to the wafer deflector 15 (step 121) and step 115 is restarted. When all of m divided patterns are exposed, the mask stage 6 and wafer stage 9 are continuously moved (step 122) and thereafter, a light-beam deflection value Sw by the wafer deflector 15 is reset to 0 and a wafer-deflector output is turned off (step 123), and step 106 is restarted to repeat the exposure of the next stripe.

This embodiment is described by assuming that a shape of a light beam is rectangular. However, it is permitted to use a shape other than a rectangle.

Figure 8:
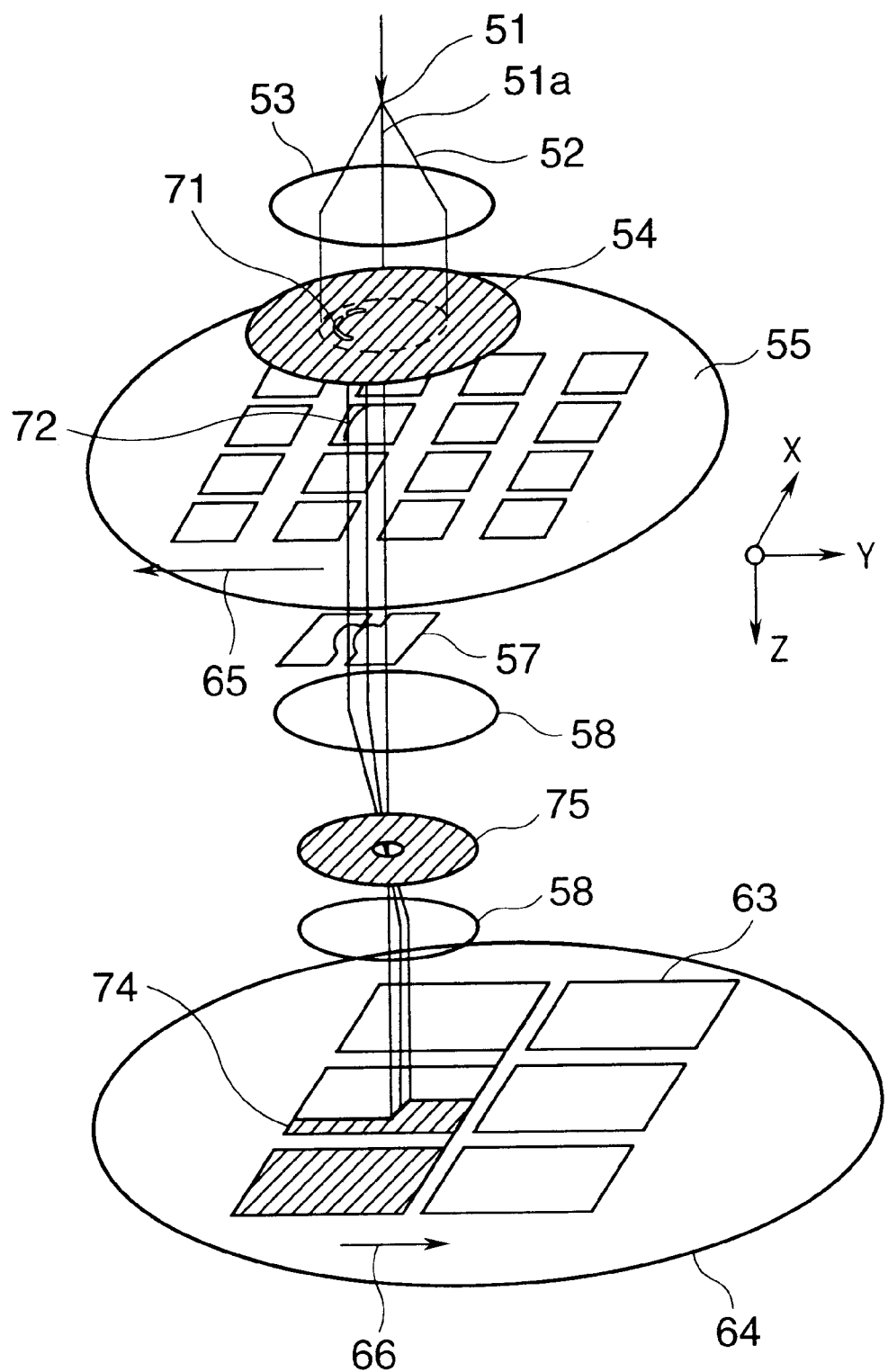
FIG. 8 is a schematic view of a circular-arc-type light-beam transfer apparatus applicable to the first embodiment of the present invention.

FIG. 8 is a block diagram of an electron-beam aligner in which an image-surface curve aberration is decreased and an exposure area is expanded by forming a light-beam shape like a circular arc in order to improve the throughput of the aligner.

An electron beam 52 emitted from an electron gun 51 is formed like a circular arc by an aperture opening 17 formed on an aperture 54 through a condenser lens 53 and then, applied to a mask 55 as an electron-beam applying area 72 on a mask. Thereafter, a divided pattern of the mask 55 is transferred onto a wafer 64 as a device pattern 63 on a wafer after passing through an aberration-correcting optical system 57, electron lens 58, and scattered-electron control aperture 75. An area 74 to which an electron beam is applied through a wafer scanning is formed like a circular arc. By forming the area 74 like a circular arc, it is possible to increase the number of stripe widths that can be exposed at the same time. Therefore, it is particularly advantageous for improvement of throughput. In the case of this apparatus, an axis 51a of an electronic optical system is deviated from a position of a circular-arc light-beam.

In the case of this embodiment, moving directions of the mask stage 6 and wafer stage 9 are changed every stripe. However, it is not always necessary to change the moving directions. It is permitted to always use the same moving direction. However, to reduce unnecessary movement of a stage and improve the throughput, it is effective to change the moving directions. It is permitted to always use the same moving direction. However, to reduce unnecessary movement of a stage and improve the throughput, it is effective to change the moving directions of a stage every stripe like the case of this embodiment.

Further, in the case of this embodiment, it is not always necessary to turn on/off the electron beam 10 every divided pattern because the electron beam 10 does not reach the cut-off wafer 8 when the electron beam 10 is located on a beam of the mask 5. However, to prevent the mask 5 from being excessively heated or abnormally exposed, or minimize a thermal strain of the mask 5, it is preferable to turn on/off the electron beam 10.

As described above, by using the wafer deflector 15 having a high response speed and making it possible to obtain a high positional accuracy and thereby properly controlling a deflection value of the electron beam 10 above the wafer 8, it is possible to prevent a pattern connection accuracy from lowering due to vibrations generated at acceleration or deceleration of a stage under mechanical connection control or a low mechanical control response speed and more easily and accurately connect divided patterns in the same stripe on the wafer 8.

(Second Embodiment)

For this embodiment, a charged-beam particle transfer apparatus and a mask pattern transfer method are described which are suitable when patterns more than the number of divided patterns in the same stripe of the first embodiment are used.

That is, in the case of the first embodiment, a transfer apparatus and a transfer method are described in which divided patterns are connected on a wafer while accumulating a light-beam deflection value corresponding to a beam width on a mask. In the case of this embodiment, however, a transfer apparatus and a transfer method will be described in which a light-beam deflection value is not accumulated.

Figure 9:
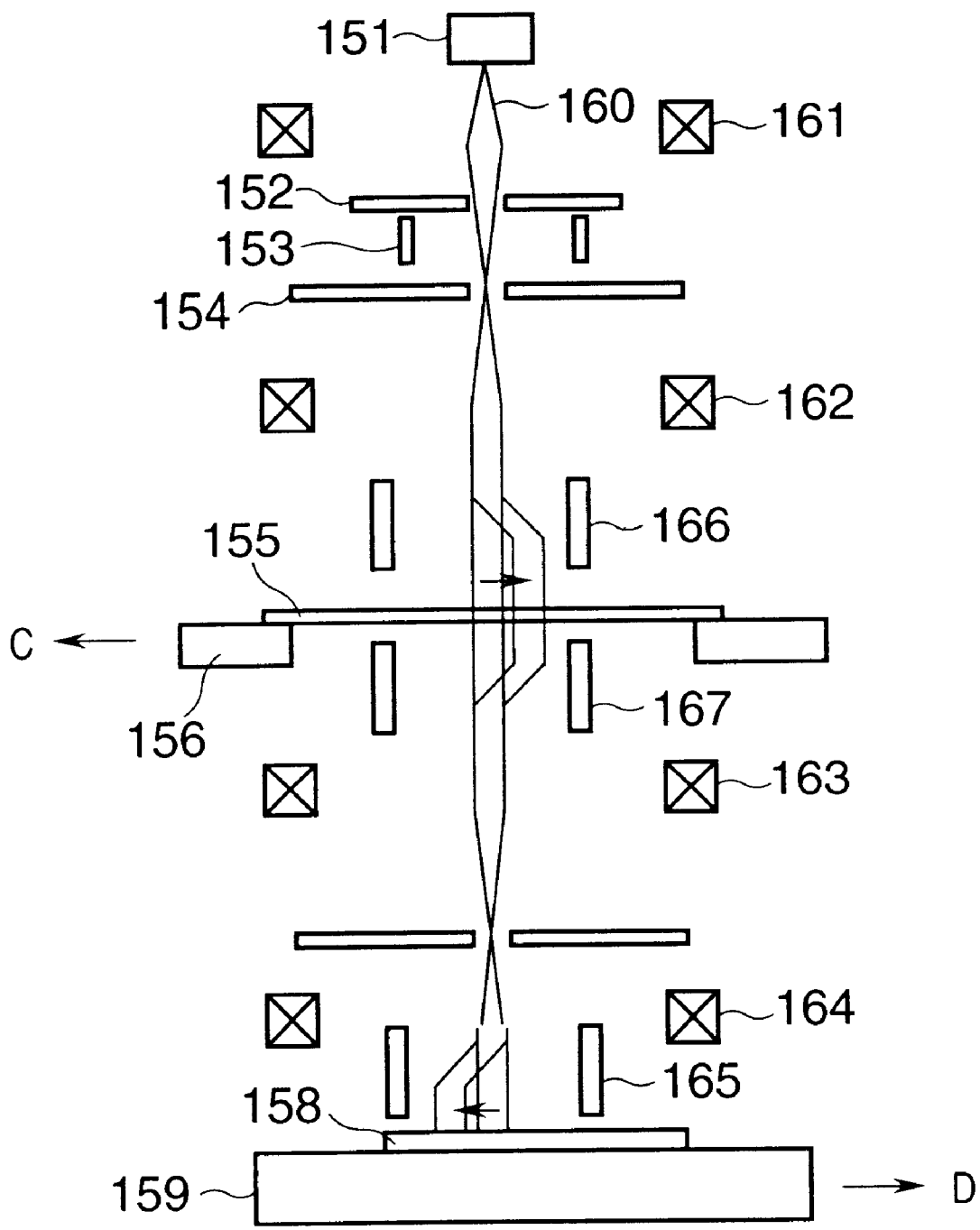
FIG. 9 is a schematic block diagram of the mask pattern transfer apparatus of the first embodiment of the present invention.

FIG. 9 shows a schematic block diagram of a mask pattern transfer apparatus of the second embodiment of the present invention.

The configuration in FIG. 9 is the same as that in FIG. 1 except that mask deflectors 166 and 167 for deflecting an electron beam 160 are newly present above a mask 155. Therefore, similarly to FIG. 1, applying means for applying the electron beam 160 serving as a charged beam to the mask 155 is configured by an electron source 151, a forming aperture 152, a blanker 153, a blanking aperture 154, a first condenser lens 161, and a second condenser lens 162. The applying means for applying the electron beam 160 to the mask 155 is able to turn on/off the electron beam 160. The electron beam 160 emitted from the electron source 151 is first deflected in the direction opposite to the continuous moving direction of the mask stage 156 shown by an arrow C by the mask deflector 166 above the mask 155 and thereafter, the optical axis of the electron beam 160 passing through the mask 155 is returned to the optical axis of the original electron source 151 by the mask deflector 167.

Thereafter, divided patterns of the mask 155 are contracted and transferred to a wafer 158 on a wafer stage 159 continuously moving in the direction opposite to the mask stage 156 indicated by an arrow D by a first projection lens 163 and a second projection lens 164. In this case, the electron beam 160 is continuously deflected in the direction opposite to the continuous moving direction of the wafer stage 159 by the wafer deflector 165 whenever each divided pattern is exposed.

Figure 10:
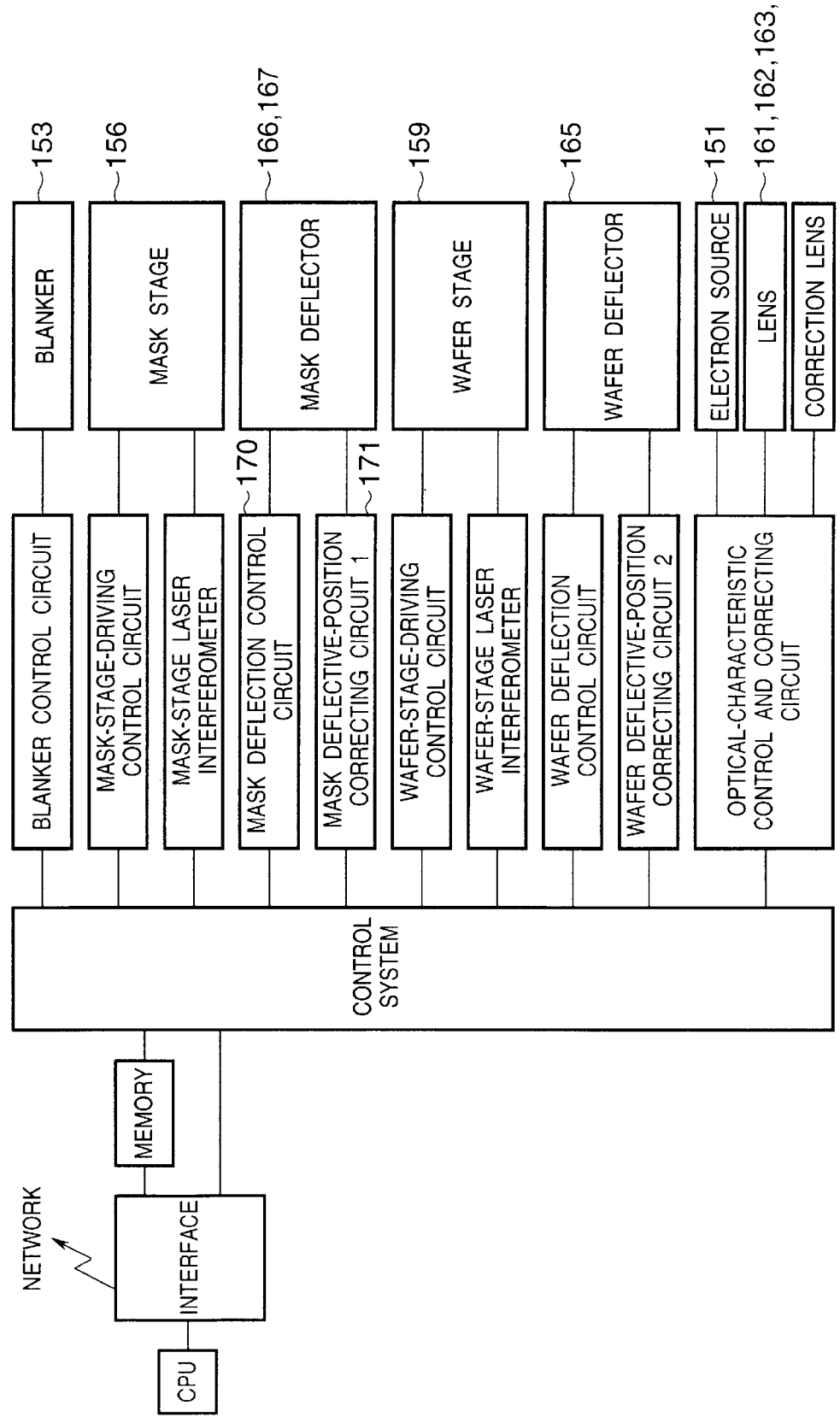
FIG. 10 is a control block diagram of the mask pattern transfer apparatus of the first embodiment of the present invention shown in FIG. 9.

FIG. 10 shows a control block diagram of the second embodiment.

Figure 2:
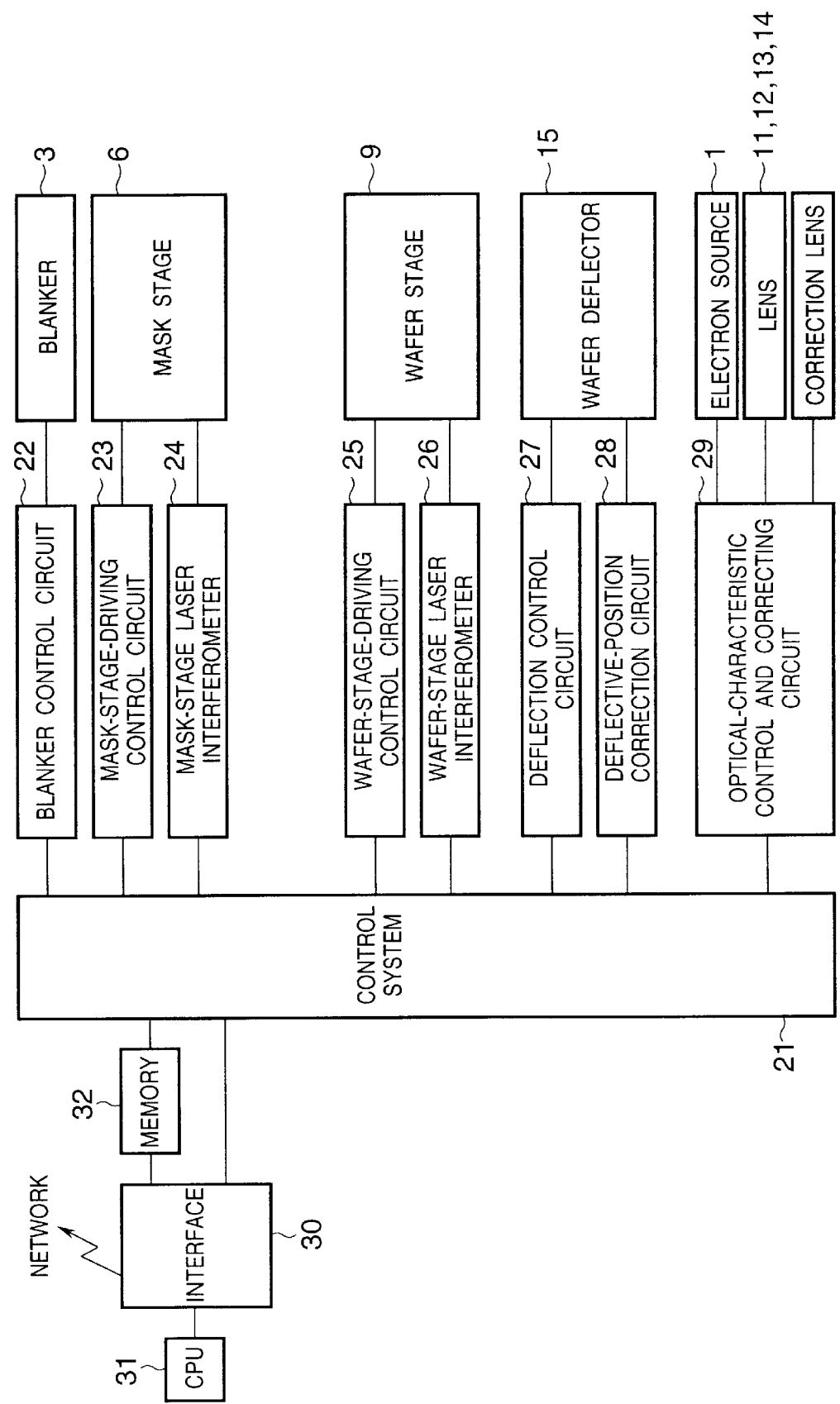
FIG. 2 is a control block diagram of the mask pattern transfer apparatus of the first embodiment of the present invention shown in FIG. 1.

Though the basic configuration is the same as that of the control block of the first embodiment shown in FIG. 2, a mask deflection control circuit 170 for controlling a deflection value of the electron beam 160 of the mask deflectors 166 and 167 and a mask-deflecting-position correction circuit 171 for correcting a position of the electron beam 160 due to a positional error of the mask stage 156 are further included.

FIGS. 11A to 11E show states in which a divided pattern M26 and a divided pattern M25 formed on the mask 155 and having a beam width s56 are connected on the wafer 158.

Symbols in FIGS. 11A to 11E are the same as those of the first embodiment shown in FIG. 4. Therefore, a description of the symbols is omitted.

Figures 11A, 11B, 11C:
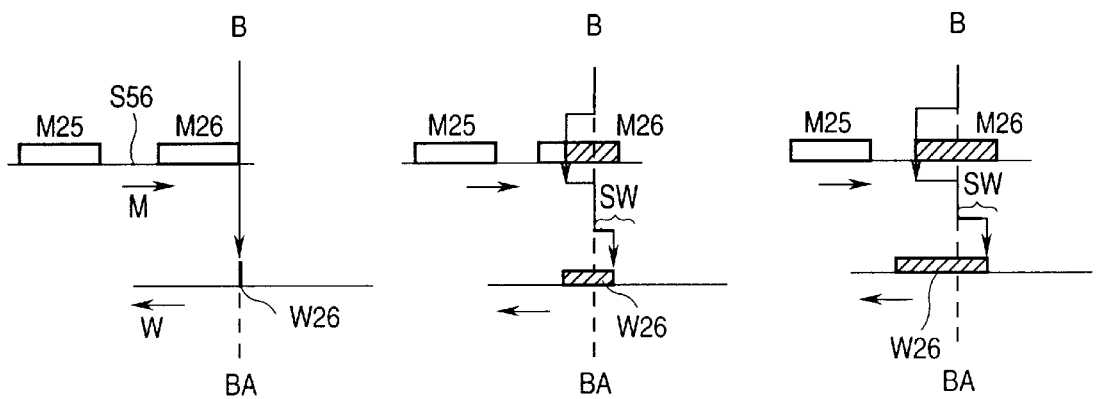
FIGS. 11A to 11E are illustrations showing states in which divided patterns on a mask are connected on a wafer in a second embodiment of the present invention.

Exposure of the divided pattern M26 onto the wafer 158 is started (FIG. 11A) and the divided pattern M26 is exposed on the wafer 158 as a divided pattern W26 to be transferred in accordance with relative movement between the mask 155 and the wafer 158 (FIG. 11B). In this case, light-beam deflection values above the mask 155 and the wafer 158 increase as time passes from a start to an end of the exposure of the same divided patterns M26. In the case of this embodiment, as shown in FIG. 9, the electron beam 160 is deflected in the direction opposite to the continuous moving direction of the mask 155 above the mask 155 by the mask deflector 166 and deflected in the direction opposite to the continuous moving direction of the wafer 158 above the wafer 158 by the wafer deflector 165.

Figures 11D, 11E:
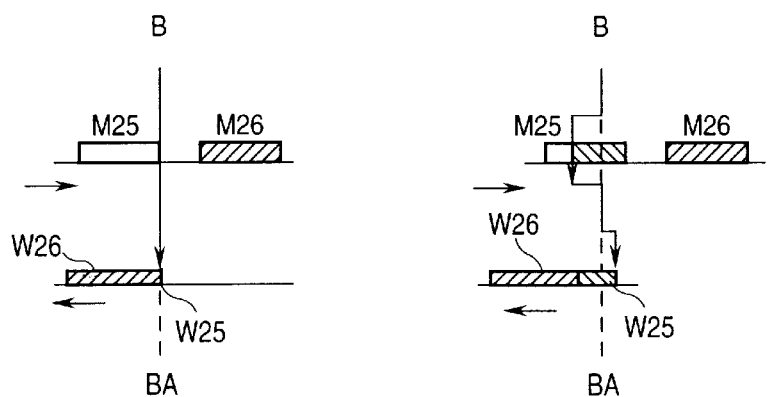

When every divided pattern M26 is exposed onto the wafer 158 as the divided pattern W26 to be transferred, exposure of the divided pattern M26 is completed (FIG. 11C) and the light-beam deflection values above the mask 155 and wafer 158 are reset to zero immediately after the exposure of the divided patterns M26 is completed to wait for a start of the exposure of the next divided pattern M25. That is, because the electron beam 160 is deflected by SW in the direction opposite to the moving direction of the wafer stage 159 under the state in FIG. 11C, light-beam blanking and resetting of outputs to the mask deflectors 166 and 167 and wafer deflector 165 are executed until the width of the exposed divided pattern W26 to be transferred on the wafer 158 moves to the position in FIG. 11D serving as the pattern start position of exposure of the next divided pattern. Then, the next divided pattern M25 is connected to the divided pattern W26 to be transferred already exposed as a divided pattern W25 to be transferred on the wafer 158 and exposed (FIG. 11E).

In the above description, a beam width is omitted in order to simplify the description. However, an example of control by a system considering up to a beam width is described below by referring to FIGS. 12A to 12D showing the state in which the divided pattern M26 is exposed onto the wafer 158 as the divided pattern W26 to be transferred and FIG. 13 which is a detailed drawing of FIG. 12C.

In FIGS. 12A to 12D, the mask stage 156 and wafer stage 159 are moved along the X-axis, and symbol (+) denotes a positive moving direction of the X-axis and (−) denotes a negative moving direction of the X-axis.

Exposure of the divided pattern M26 onto the wafer 158 is started (FIG. 12A) and the divided pattern M26 is exposed onto the wafer 158 as the divided pattern W26 to be transferred serving as a divided pattern in accordance with the relative movement between the mask 155 and the wafer 158 (FIG. 12B).

Immediately after the exposure is completed (FIG. 12C), the electron beam 160 is blanked and a light-beam deflection value is returned to zero. In this case, the final end of the divided pattern W26 to be transferred is located in the direction opposite to the moving direction of the wafer 158 by a distance shown by SW in FIG. 12C on the wafer 158. Therefore, a margin time is produced until the exposure final end of the divided pattern W26 to be transferred moves to the position of the exposure start end of the next divided pattern W25 to be transferred, that is, until the positional relation in FIG. 12D is obtained. The margin time is controlled so that it becomes equal to a time until the positional relation in FIG. 12D in which transfer of the divided pattern M25 is started from FIG. 12C in which transfer of the divided pattern M26 is completed on the mask 155, that is, it becomes equal to a time required for the mask 155 to move on a beam width between divided patterns (more correctly, beam width-light-beam width) on the same stripe. Details of the above control are described later.

Then, exposure of the next divided pattern is started (FIG. 12D). By repeating the same operations as those in FIGS. 12A to 12C for M25 and later serving as the next divided patterns, it is possible to connect divided patterns on the wafer 158 without accumulating a deflection value of the electron beam 160.

Figure 13:
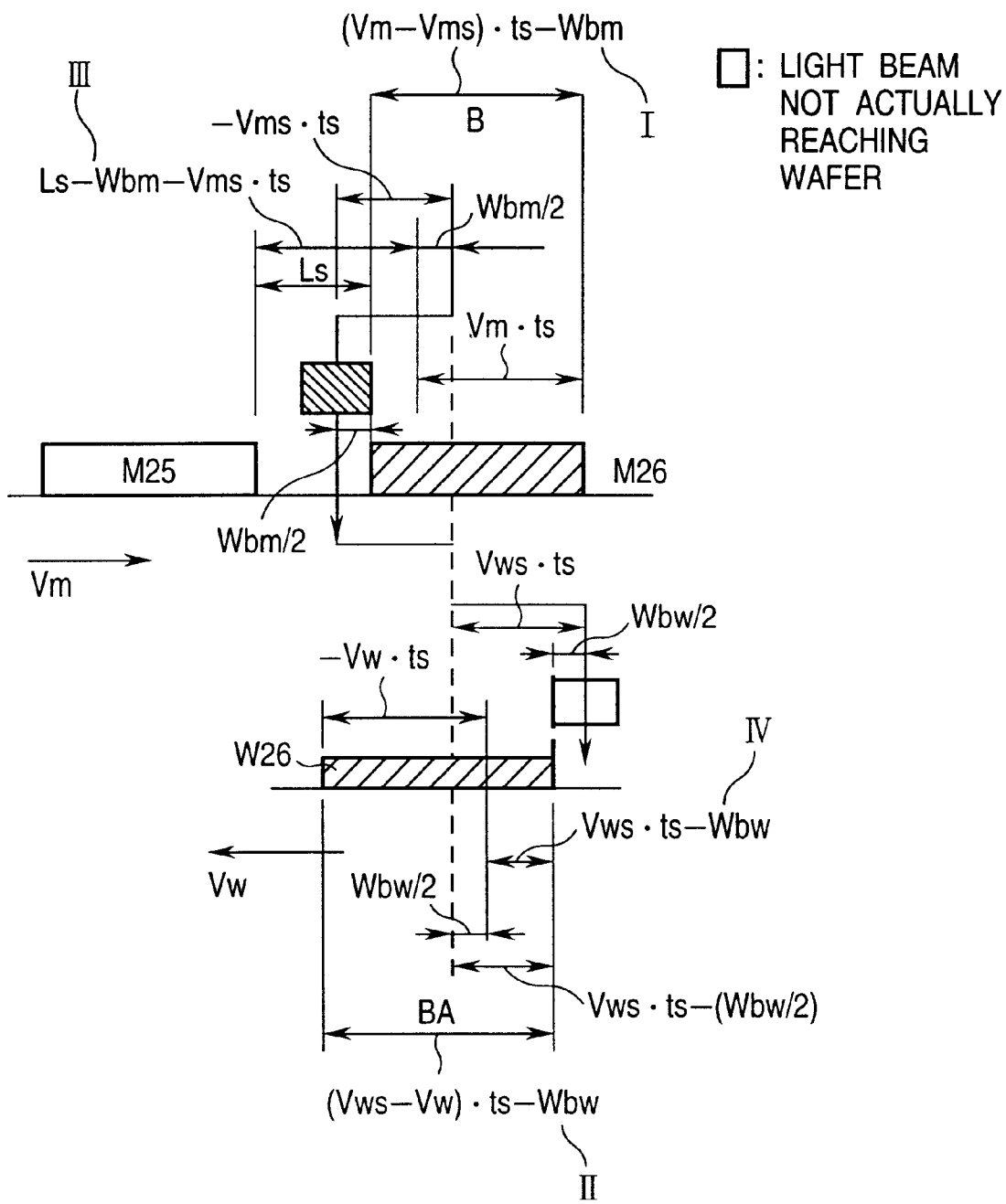
FIG. 13 is an enlarged detailed view of the arrangement shown in FIG. 12C.

FIG. 13 shows details of dimensions at the position of FIG. 12C.

In this case, it is assumed that a mask speed is Vm, a light-beam deflection speed on the mask 155 is Vms, a wafer speed is Vw, a light-beam deflection speed on the wafer 158 is Vws, a light-beam width on the mask 155 is Wbm, a light-beam width on the wafer 158 is Wbw, an optical magnification is 1/M, a time in which the electron beam 160 is deflected on the mask 155 and wafer 158 is ts, a length of a divided pattern on the mask 155 is Lp, a beam width between divided patterns on the mask 155 is Ls, a resist sensitivity is S, a ligth-beam current value on the wafer 158 is I, and a length of a ligth beam on the wafer 158 is Lby. Symbols of Vm, Vms, Vw, and Vws are assumed to be positive of X to be negative for a negative direction of X.

In this case, it is preferable to control a system so that the following expressions (3) to (7) are effected.

$$(-Vms+Vm)\cdot ts = Lp+Wbm \tag{3}$$

$$(Lp+Wbm)/M = (-Vw+Vws)\cdot ts \tag{4}$$

$$(Ls-Wbm-Vms\cdot ts)/Vm = (ts\cdot Vws-Wbw)/(-Vw) \tag{5}$$

$$-Vw+Vws = I/(Lby\cdot S) \tag{6}$$

$$Wbm = M\cdot Wbw \tag{7}$$

(Where $Ls > Wbm$)

The expression (3) shows that the electron beam 160 relatively moves for the mask 155 by a distance equal to the sum of a divided pattern length and a light-beam width on the mask 155 during the time ts on the mask 155. The expression (3) is equivalent to the fact that the value shown by I in FIG. 13 is equal to the length Lp of a divided pattern.

The expression (4) is equivalent to $(-Vms+Vm)M=-Vw+Vws$ from the expression (3). This shows that a distance for a unit time when the electron beam 160 relatively moves for the wafer 158 on the wafer 158 is equal to optical-magnification times of a distance for a unit time when the electron beam 160 relatively moves for the mask 155. The expression (4) is equivalent to the fact that optical-magnification time of the value shown by I in FIG. 13 is equal to the value shown by II in FIG. 13.

The expression (5) shows that a mechanical mask-moving time from an end of transfer of a certain divided pattern (assumed as M26) up to a start of transfer of the next divided pattern (assumed as M25) on the mask 155 is equal to a mechanical wafer-moving time from an end of transfer of a corresponding pattern (divided pattern W26 to be transferred) up to a start of transfer of the next corresponding pattern (divided pattern W25 to be transferred on the wafer 158). The expression (5) is equivalent to the fact that time required for a mask to mechanically move by the distance shown by III in FIG. 13 is equal to a time required for a wafer to mechanically move by the distance shown by IV in FIG. 13.

The expression (6) is a relational expression for obtaining a dose corresponding to a sensitivity of a resist used on the wafer 158.

The expression (7) is a relational expression determined in accordance with an electronic optical system of a system.

It is possible to control a system with parameters meeting these expressions (3) to (7) and a procedure for determining each parameter is described below.

Among variables in the expressions (3) to (7), five variables such as Wbm, M, Wbw, I, and Lby are determined in accordance with an electronic optical system designed so that the maximum throughput can be obtained under a condition in which pattern resolution and accuracy respectively become equal to or less than an allowable value. Moreover, symbol S is a value determined in accordance with a resist used. Furthermore, Lp and Ls are mainly determined in accordance with mechanical strength and thermal strain of the mask required from pattern resolution and accuracy.

From the above viewpoint, five unknowns such as Vm, Vms, Vw, Vws, and ts are determined in accordance with the four expressions (3) to (6) when values of eight variables Wmb, M, Wbw, I, Lby, S, Lp, and Ls are given. This is a typical example for determining control variables. To connect divided patterns on the wafer 158, a condition of Vws>0, that is, a condition of Vw+1/(Lby·S)>0 is necessary in accordance with the expression (6). Therefore, it is possible to use an optional Vw as a temporary Vw in a range of meeting the above condition. It is possible to assuredly determine four variables such as Vm, Vms, Vws and ts in accordance with the expressions (3) to (6) by using the temporary Vw. Finally, it is preferable to use a set of variable values suitable for control of an exposure system among a set of five variable values such as the temporary Vw and Vm, Vms, Vws, and ts determined in accordance with the temporary Vw.

Table 1 shows numerical values of this embodiment thus obtained.

In Table 1, a deflection distance denotes a product of a deflection speed (Vws or Vms) and a deflection time ts.

TABLE 1

| | Wafer side | | | Mask side | | | |
|---|---|---|---|---|---|---|---|
| I [uA] | Vw [mm/s] | Vws [mm/s] | Deflection distance [mm] | Vm [mm/s] | Vms [mm/s] | Deflection distance [mm] | Deflection time ts [ms] |
| 3 | −23.3 | 10 | 0.78 | 121.3 | −12 | −0.94 | 78 |
| 5 | −41.6 | 14 | 0.66 | 216.1 | −6.1 | −0.29 | 47 |
| 8 | −64.9 | 24 | 0.70 | 337.4 | −18.1 | −0.53 | 29 |

As for the above variables, M is equal to 4, Wbw is equal to 0.1[mm], Lby is equal to 3[mm], Lp is equal to 10[mm], Ls is equal to 3[mm], and S is equal to 3[uC/cm$^2$].

Figure 14:
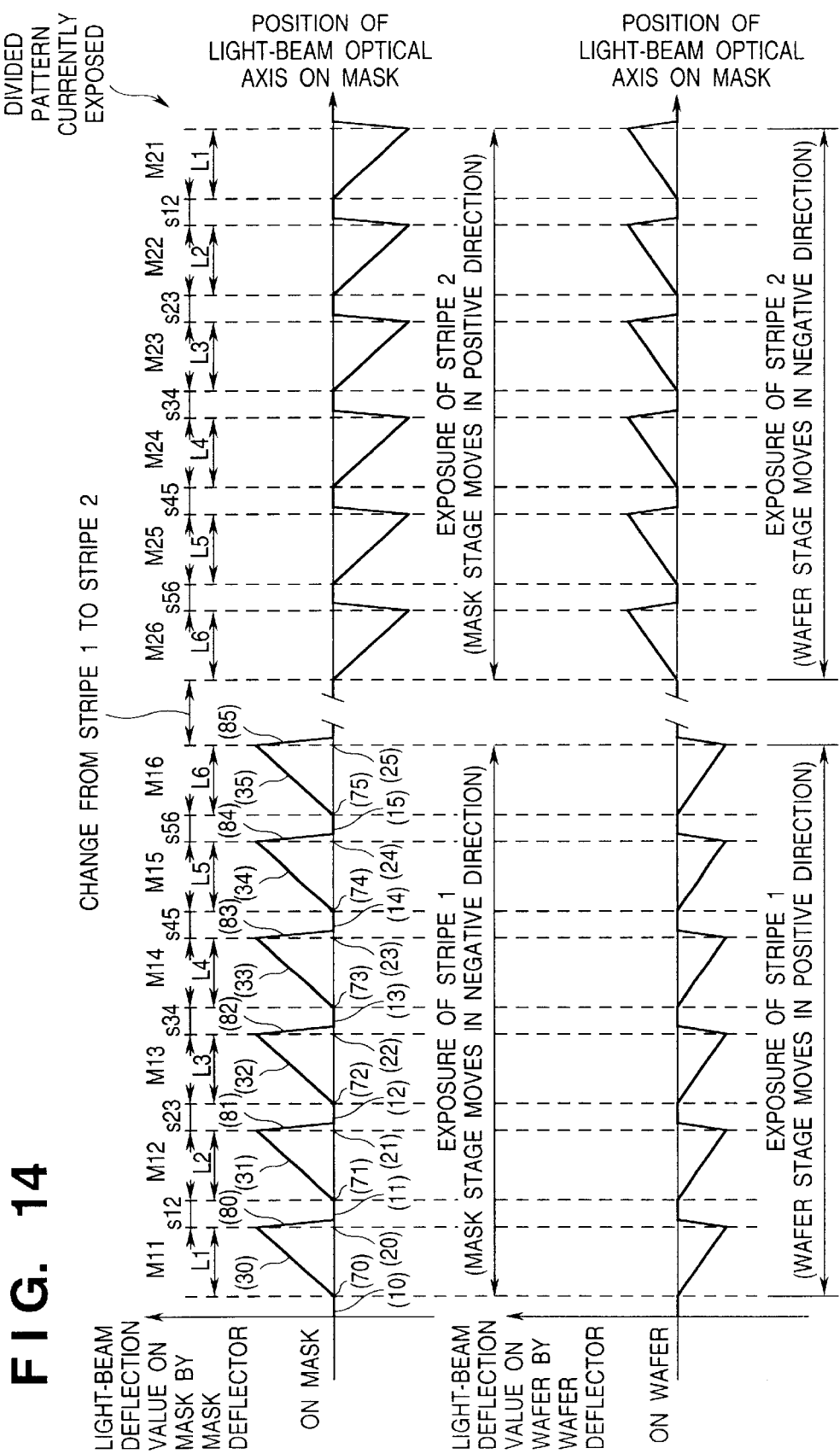
FIG. 14 is an illustration showing the relation between a light-beam deflection value by a mask deflector and a wafer deflector of the second embodiment of the present invention and a position of a light-beam optical axis on a mask.

FIG. 14 shows the relation between a light-beam deflection value by the wafer deflector 165 and a position of a light-beam optical axis on the mask 155 in this embodiment.

The vertical axis denotes light-beam deflection values by the mask deflectors 166 and 167 and the wafer deflector 165.

The light-beam deflection values by the mask deflectors 166 and 167 and the wafer deflector 165 increase as time passes while exposing divided patterns. However, when exposure of the divided patterns is completed, each light-beam deflection value returns to zero and it is not accumulated.

Figure 15A:
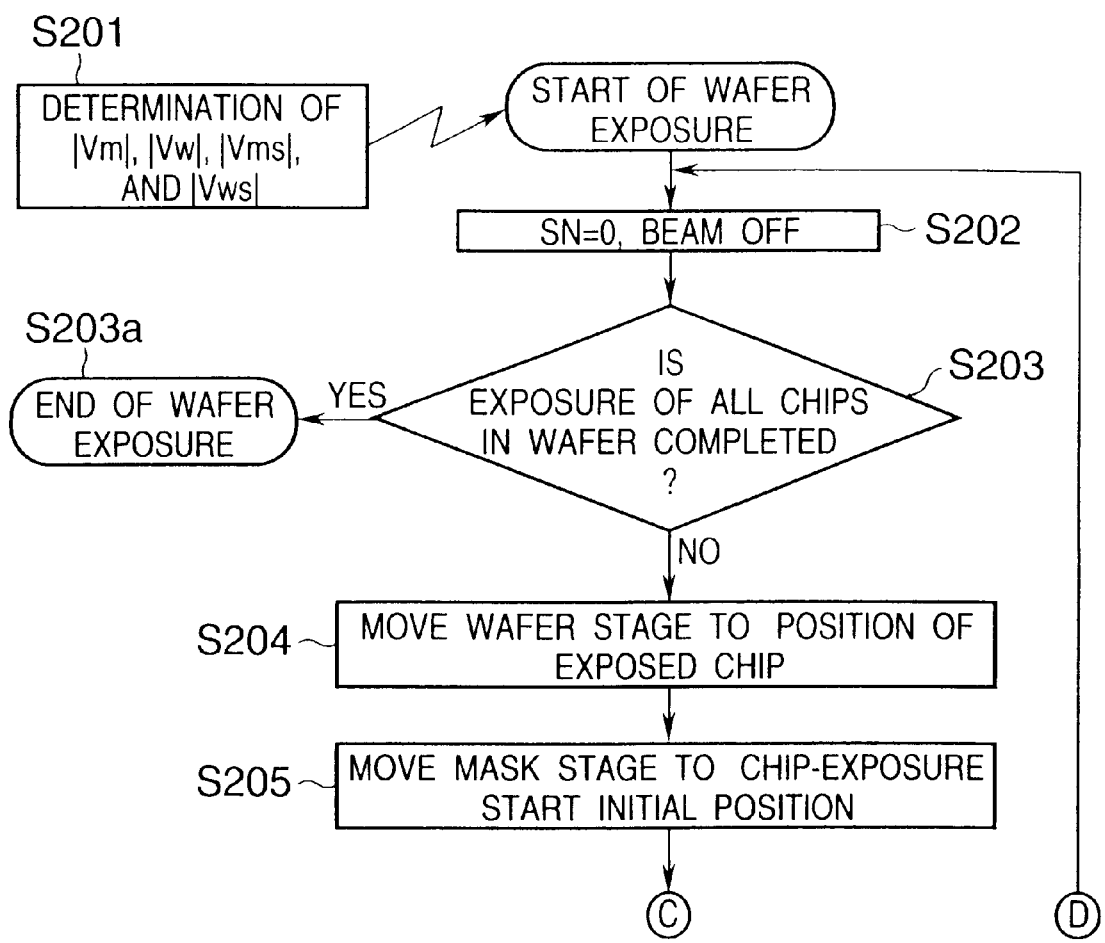
FIGS. 15A and 15B are flow charts for wafer exposure of the second embodiment of the present invention.
Figure 15B:
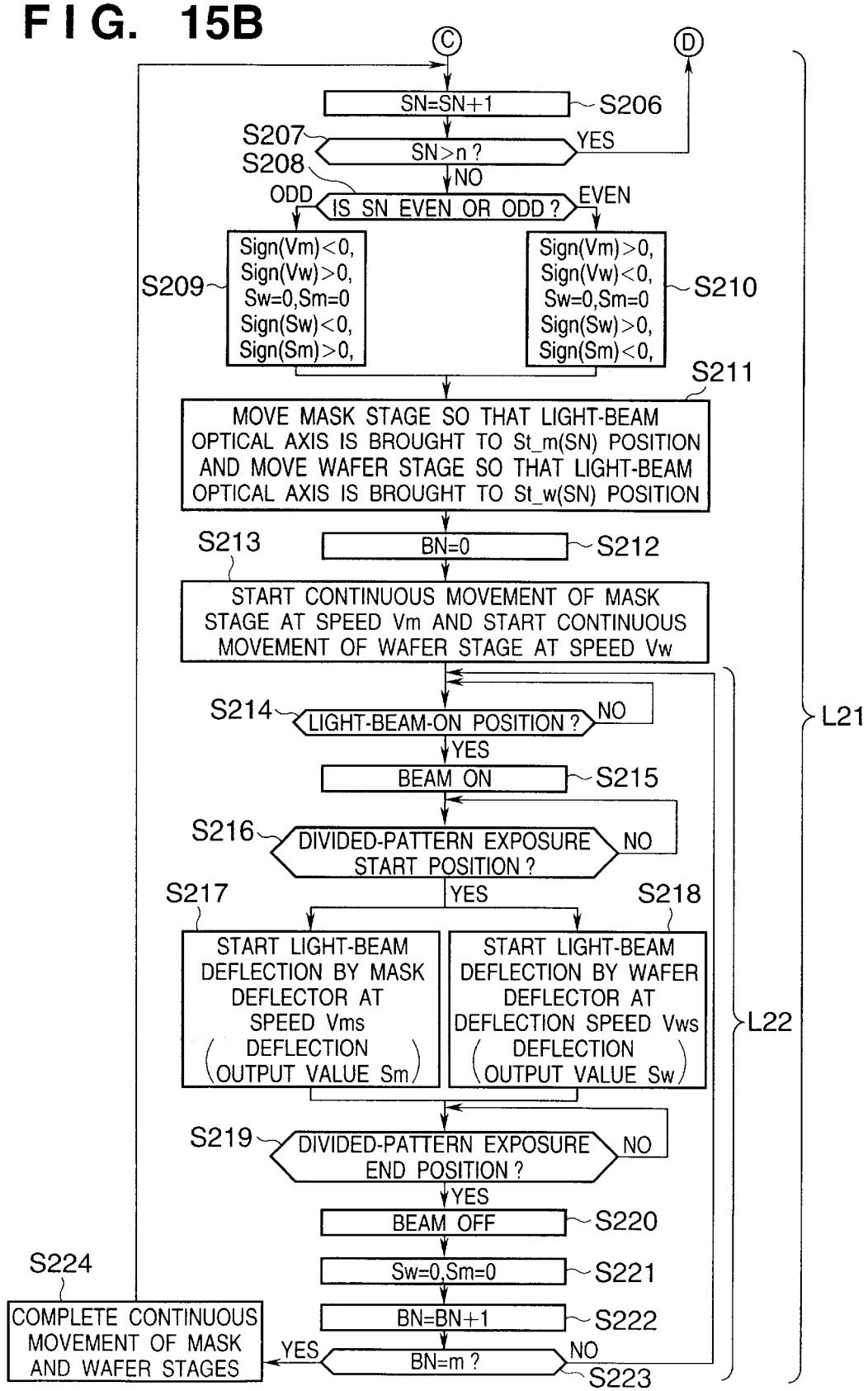

FIGS. 15A and 15B show flow charts for wafer exposure in this embodiment.

Symbols in FIGS. 15A and 15B are the same as in the case of the first embodiment. Therefore, only new symbols used for this embodiment (although they do not appear in FIGS. 6 and 7) are described below.

Symbol Sm denotes a light-beam reflection value on the mask 155 by the mask deflector 166, sign (Sm) denotes a direction of a light-beam deflection value on the mask by the mask deflector 166, Vms denotes a light-beam deflection speed {when assuming elapsed time as "t," an expression Sm=∫Vmsdt is effected} on the mask 155 by the mask deflector 166, and Vws denotes a light-beam deflection speed (when assuming elapsed time as "t," an expression Sw=∫Vwsdt is effected) on the wafer 158 by the wafer deflector 165.

Exposing steps of the wafer of this embodiment will be described below by referring to FIGS. 7A and 7B and FIGS. 15A and 15B.

A mask stage speed |Vm|, wafer stage speed |Vm|, a beam defection speed |Vms| on a mask by a mask deflector, and a beam deflection speed |Vws| on a wafer by a wafer deflector are determined (step 201). To determine these values, it is permitted to store results computed by a computer out of an apparatus in a memory of an apparatus via a network or compute values by a computer of the apparatus.

Exposure is started in accordance with the computed values obtained in step 201.

Steps 202 to 208 correspond to steps 102 to 108 of the first embodiment in FIGS. 6A and 6B.

That is, for stripe number SN=0, the electron beam 160 is kept turned-off (step 202). Then, it is judged whether exposure of every chip to be exposed in the wafer 158 is completed (step 203). When exposure of every chip is completed, exposure of the wafer 158 is completed (step 203a). If there are some chips that are not exposed yet, the next step is started in order to expose the next chip.

The wafer stage 159 is moved to a position at which a chip pattern should be exposed on the wafer 158 (step 204). This position is a position where the central position of an exposed chip pattern coincides with a light-beam optical axis.

Then, the mask stage 156 is moved to a chip-start initial position (step 205). This position is a position where the vicinity of the position of St-m(1) in FIG. 7A serves as a light-beam optical axis.

Then, when the stripe number judged in step 208 is odd, a moving direction of the mask stage 156 is set to the negative direction of the X-axis, a moving direction of the wafer stage 159 is set to the positive direction of the X-axis, deflection values by the mask deflector 166 and the wafer deflector 165 are reset to zero, a deflecting direction of the wafer deflector 167 is set to the negative direction of the X-axis, and a deflecting direction of the mask deflector 166 is set to the positive direction of the X-axis (step 209).

When the stripe number is even, the above directions are respectively set to the opposite direction (step 210).

Steps 211 to 213 correspond to steps 111 to 113 of the first embodiment in FIGS. 6A and 6B.

That is, the mask stage 156 is moved so that the light-beam optical axis is brought to the position of St_m(SN) on the mask 155 and the wafer stage 159 is moved so that the light-beam optical axis is brought to the position of St_w (SN) on the wafer (step 111). Thereby, the mask 155 and wafer 158 are located at one-stripe exposure start position.

Then, a divided pattern number BN on a stripe is reset to zero (step 212).

Then, continuous movements of the mask stage 156 and wafer stage 159 are started at speeds of |Vm| and |Vw| in directions set in step 209 or 210 (step 213).

A loop L22 denotes a loop for exposing all of m divided patterns present on a certain stripe and completing the exposure for one stripe.

Steps 214 to 216 correspond to steps 115 to 117 of the first embodiment in FIGS. 6A and 6B.

First, it is judged whether the present position is a position for turning on the electron beam 160 in order to expose divided patterns (step 214) and the electron beam 160 is turned on after divided patterns are moved (step 215). This position is set so that it is located slightly forward than a divided-pattern exposure start position to the moving direction of the mask 155 and the divided-pattern exposure start position comes on a light-beam optical axis after a setting time of the electron beam 160 elapses. The positions shown by (10) to (15) in FIG. 14 respectively correspond to the above position.

Then, it is judged whether the mask arrives at the divided-pattern exposure start position serving as a divided-pattern exposure start end (step 216). When the mask arrives at the position, light-beam deflection is started at the deflection speed Vms by the mask deflector 166 above the mask 155 (step 217) and at the same time, light-beam deflection is started at a deflection speed Vws by the wafer deflector 165 above the wafer 158 (step 218). The positions shown by (70) to (75) in FIG. 14 respectively correspond to the above position. When deflection speeds Vws and Vms are constant, each light-beam deflection value linearly changes as shown by (30) to (35) in FIG. 14.

Then, it is judged whether the mask reaches a divided-pattern exposure end position serving as the other end of divided patterns (step 219). When the mask reaches the position, the light beam is turned off (step 220), deflection values by the mask deflector 166 and wafer deflector 165 are reset to zero (step 221), and the divided-pattern number BN is increased by 1 (step 222). This position corresponds to each of the positions shown by (20) to (25) in FIG. 14. Thereby, the deflection values by the mask deflector 166 and wafer deflector 165 are returned to zero when exposure of each divided pattern is completed as shown by (80) to (85) in FIG. 14. Therefore, as shown in FIG. 14, the deflection values by the mask deflector 166 and wafer deflector 165 are not accumulated when a deflection speed is constant but they become serrated.

It is judged whether all of m divided patterns on one stripe are exposed (step 223). If not all divided patterns are exposed, it is waited in step 214 for the mask 155 to come to the next-divided-pattern light-beam-on position. When all divided patterns are exposed, continuous movement of the mask stage 156 and wafer stage 159 is completed (step 224) and then, step 206 is restarted to repeat exposure of the next stripe.

In the case of this embodiment, a mask-deflector output becomes zero immediately after exposure is completed as shown in FIG. 11C. Therefore, unless a light beam is turned off, the light beam crosses the divided pattern M26 and thereby, correct transfer cannot be performed. Therefore, light-beam blanking is indispensable.

In the case of this embodiment, by deflecting the electron beam 160 in the opposite direction to the moving direction of the mask stage 156 on the mask 155, it is possible to lower the speed of the mask stage 156 compared to the case of deflecting the electron beam 160 in the same direction as the moving direction of the mask stage 156. Therefore, it is possible to reduce the accuracy deterioration due to vibrations and deflection of the electron beam 160 in the opposite direction is particularly effective when laying stress on accuracy.

Continuous movement of a stage and continuous deflection of a light beam include their speed change. For example, when controlling dulling of a light beam due to the coulomb effect by changing light-beam currents in accordance with a pattern density change of a divided pattern, wafer speed Vw and light-beam deflection speed Vws on the wafer 158 must be changed in order to keep an exposure value on the wafer 158 constant as understood from the expression (6). This also means a change of mask speed Vm and light-beam deflection speed Vms on the mask 155 in accordance with expressions (3) and (5). Thus, a continuous movement speed of the mask stage 156 and wafer stage 159 and continuous deflection speed of the electron beam 160 on the mask 155 and wafer 158 are not always constant but include the case in which these speeds are slowly changed. However, the control at a constant speed is more accurate and easier than the control of changing speeds of the mask stage 156 or wafer stage 159 or changing deflection speeds of the mask deflector 166 or wafer deflector 165. Therefore, it is preferable to perform control at a speed as constant as possible.

For this embodiment, a light-beam shape is described as a rectangle. However, this embodiment can be also applied to a circular-arch light beam improving throughput similarly to the case of the first embodiment.

As described above, this embodiment is particularly effective when more divided patterns are used in the same stripe and makes it possible to obtain a desired pattern without lowering any pattern connection accuracy similarly to the case of the first embodiment.

(Third Embodiment)

Figure 16:
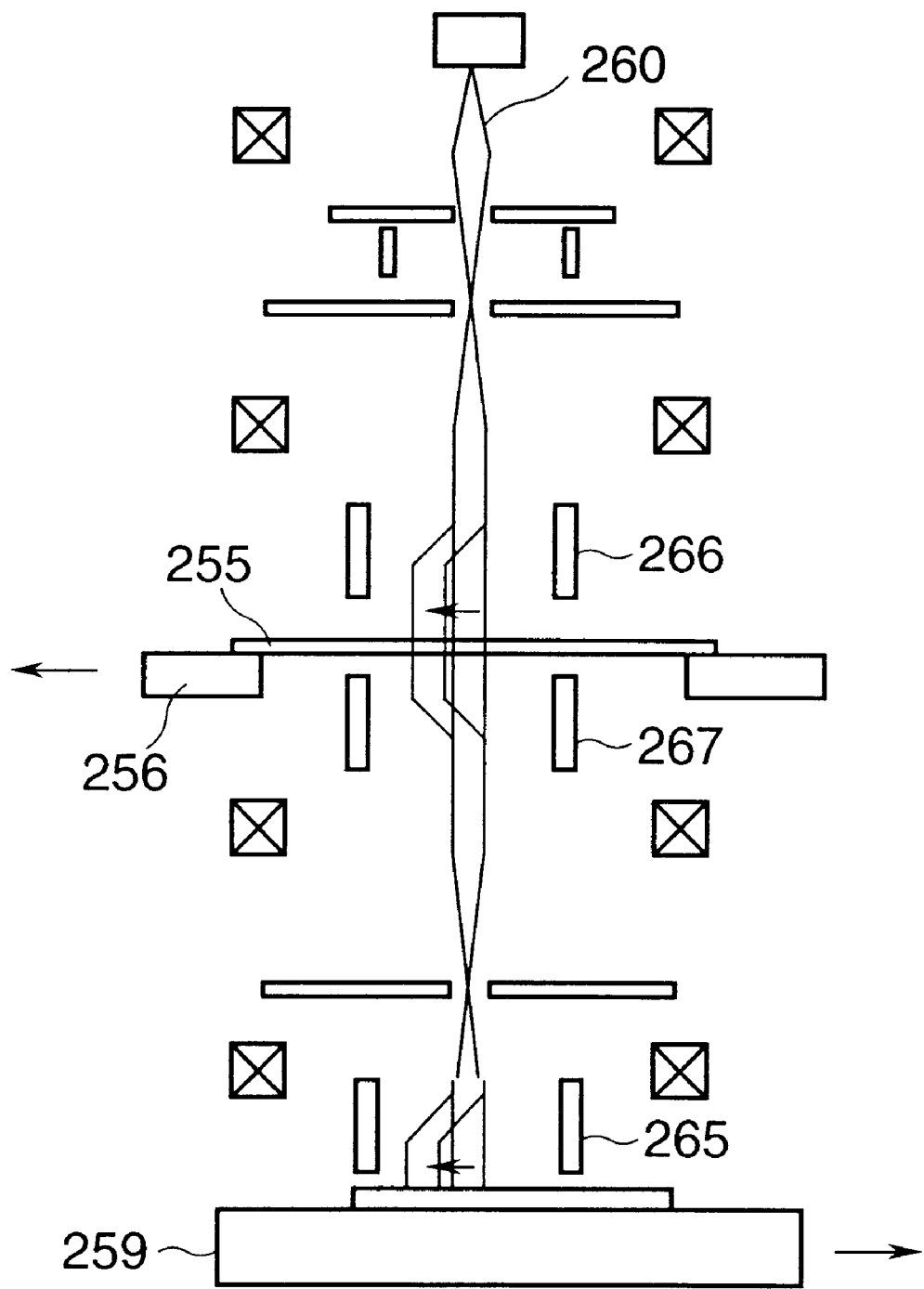
FIG. 16 is a schematic block diagram of a mask pattern transfer apparatus of a third embodiment of the present invention.
Figures 17A, 17B, 17C:
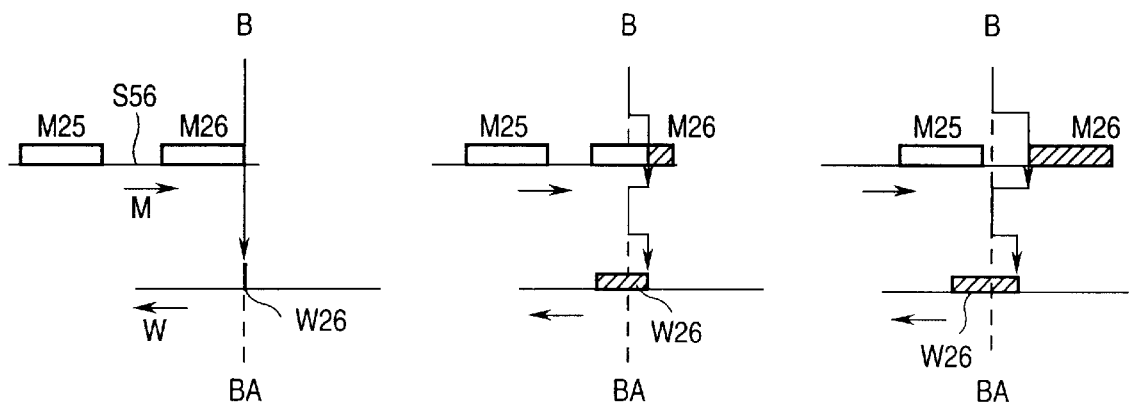
FIGS. 17A to 17E are illustrations showing states in which divided patterns on a mask of the third embodiment of the present invention are connected on a wafer.
Figures 17D, 17E:
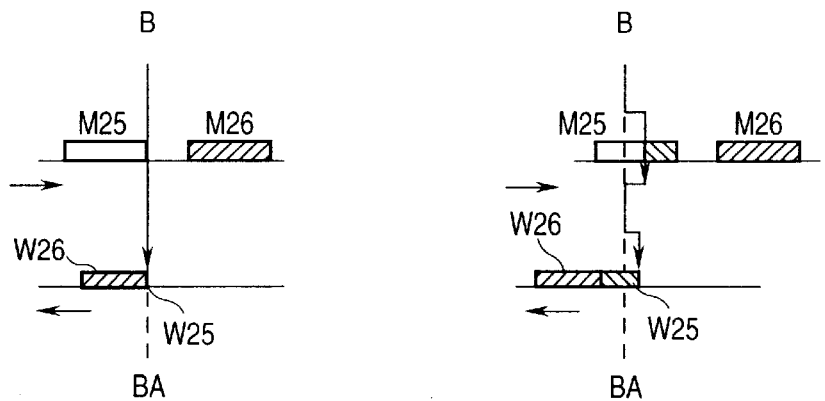

FIG. 16 shows a schematic configuration of the charged-beam particle transfer apparatus of the third embodiment.

The configuration of the charged-beam particle transfer apparatus of this embodiment is basically the same as that of the second embodiment shown in FIG. 9 except that deflective directions of an electron beam 260 by a mask deflector 266 and a mask deflector 267 are opposite to the case of the second embodiment, that is, the deflective direction by the mask deflector 266 is the same as the moving direction of a mask stage 256. Therefore, detailed description is omitted.

Moreover, a control block of this embodiment is the same as that of the second embodiment in FIG. 10.

FIGS. 17A to 17E show states in which a divided pattern M26 having a beam width S56 and a divided pattern M25 are connected to each other on a wafer 158.

The states shown in FIGS. 17A to 17E are basically the same as the states shown in FIGS. 11A to 11E for the second embodiment except that a light-beam deflective direction on the mask 255 is the same direction as the arrow M showing the moving direction of the mask 255. Therefore, detailed description is omitted.

Figure 18:
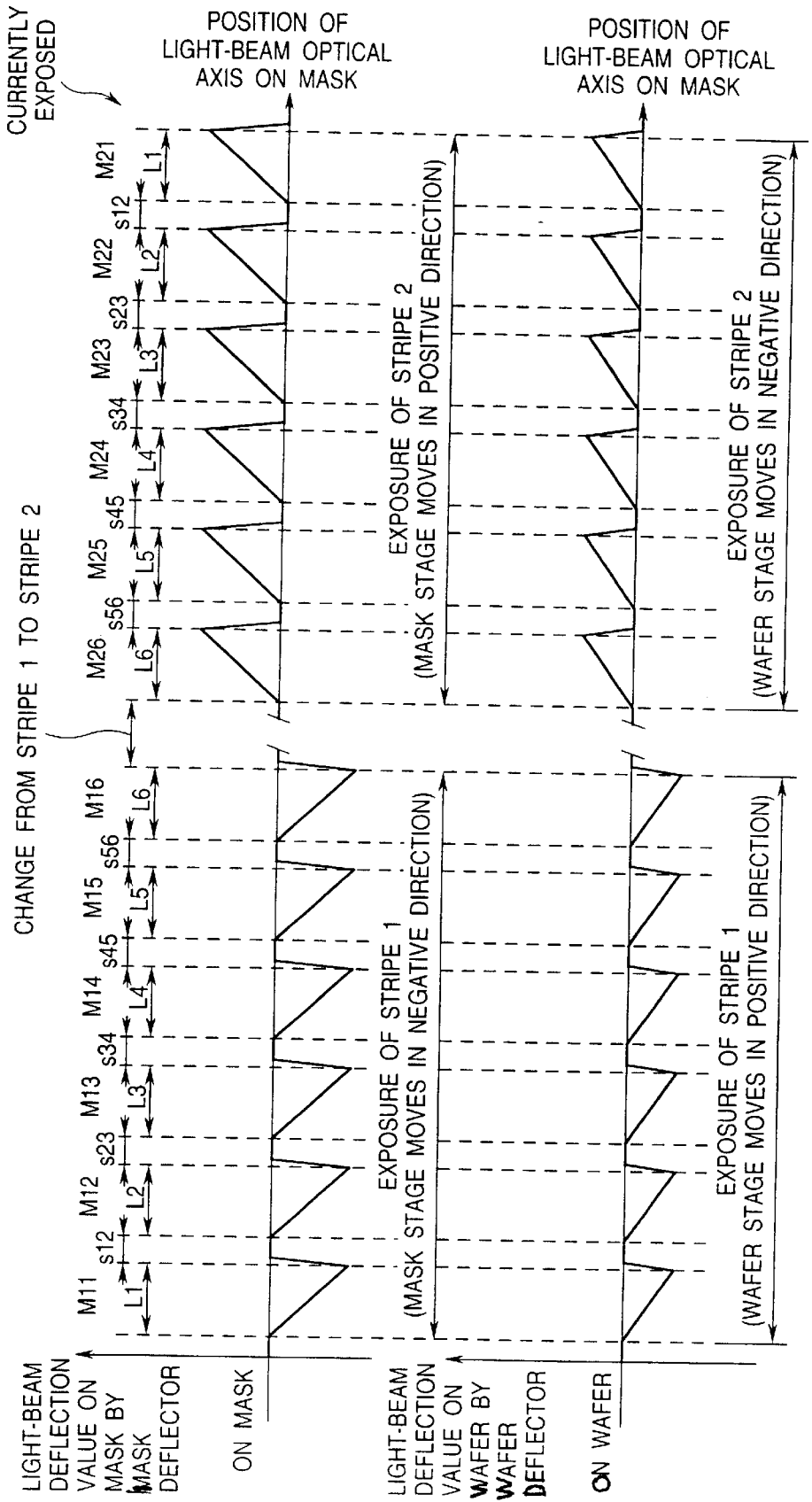
FIG. 18 is an illustration showing the relation between a light-beam deflection value by the mask deflector and wafer deflector of the second embodiment of the present invention and a position of a light-beam optical axis on a mask.

FIG. 18 shows the relation between a light-beam deflection value by a wafer deflector 265 and a position of a light-beam optical axis on the mask 255 in this embodiment.

This relation is also the same as the case of the second embodiment except that the light-beam deflective direction on the mask 255 is opposite to the direction shown in FIG. 14 and no light-beam deflection value is accumulated.

Figure 19A:
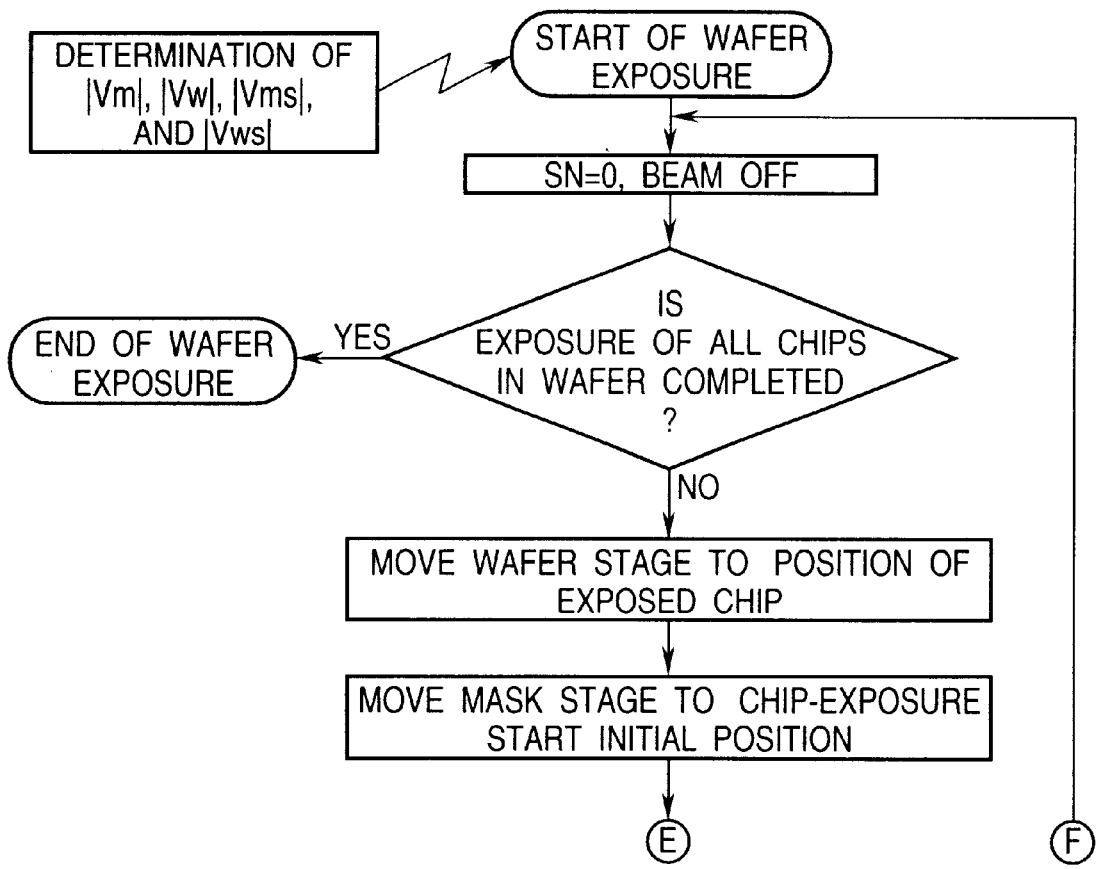
FIGS. 19A and 19B are flow charts for wafer exposure of the third embodiment of the present invention.
Figure 19B:
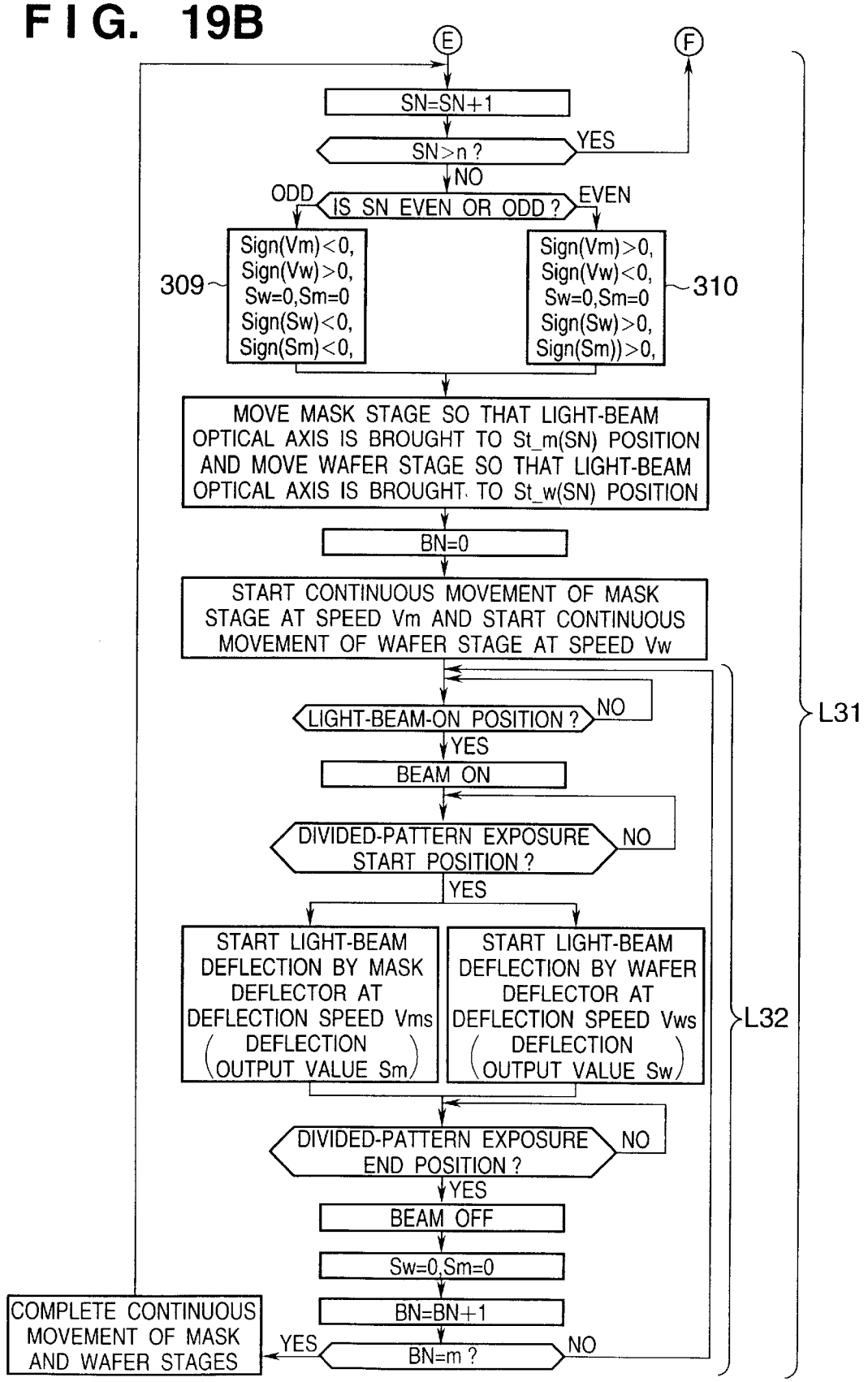

FIGS. 19A and 19B show a flow chart for wafer exposure steps in this embodiment.

Because FIGS. 19A and 19B are the same as FIGS. 15A and 15B except that codes of sign(Sm) in steps 309 and 310 are opposite to those in steps 209 and 210 in the flow chart of the second embodiment shown in FIGS. 15A and 15B, detailed description is omitted.

Table 2 shows numerical values about exposure in this embodiment.

TABLE 2

| 1 [uA] | Wafer side | | | Mask side | | | Deflection time ts [ms] |
|---|---|---|---|---|---|---|---|
| | Vw [mm/s] | Vws [mm/s] | Deflection distance [mm] | Vm [mm/s] | Vms [mm/s] | Deflection distance [mm] | |
| 8 | −72.9 | 16 | 0.47 | 379.0 | 23.5 | 0.69 | 29 |

As for the above variables, M is equal to 4, Wbw is equal to 0.1 [mm], Lby is equal to 3 [mm], Lp is equal to 10 [mm], Ls is equal to 3 [mm], and S is equal to 3 [uC/cm$^2$].

In the case of this embodiment, a divided pattern M26 is not crossed when a light-beam deflection value is reset to zero immediately after exposure is completed differently from the case of the second embodiment. Therefore, it is not always necessary to turn on/off a light beam for every divided pattern. However, it is preferable to turn on/off the light beam for every divided pattern in order to prevent the mask 255 from being excessively heated and to minimize a thermal strain.

Moreover, in the case of this embodiment, the shape of the electron beam 260 can be applied to not only a rectangular light beam but also a circular-arc light beam improving throughput similarly to the case of the first embodiment. As described above, in the case of this embodiment, it is possible to set speeds of a mask stage 256 and a wafer stage 259 to large values and thereby improve the throughput. Therefore, this embodiment is effective when laying stress on throughput without accumulating a light-beam deflection value and makes it possible to obtain a desired pattern without lowering a pattern connection accuracy similarly to the cases of the first and second embodiments.

(Fourth Embodiment)

FIG. 20 shows a schematic configuration of a charged-beam-particle transfer apparatus of the fourth embodiment of the present invention.

The charged-beam-particle transfer apparatus of this embodiment is the same as the first embodiment in apparatus configuration except that an electron beam 360 is deflected by a wafer deflector 365 in the same direction as a wafer stage 359. Therefore, detailed description is omitted.

Moreover, a control block diagram of this embodiment is the same as that of the first embodiment in FIG. 2.

FIGS. 21A to 21E show states in which a divided pattern M26 having a beam width S56 is connected with a divided pattern M25 on a wafer 158.

Because symbols in FIGS. 21A to 21E are the same as those of the first embodiment shown in FIG. 4, their descriptions are omitted.

Figures 21A, 21B, 21C:
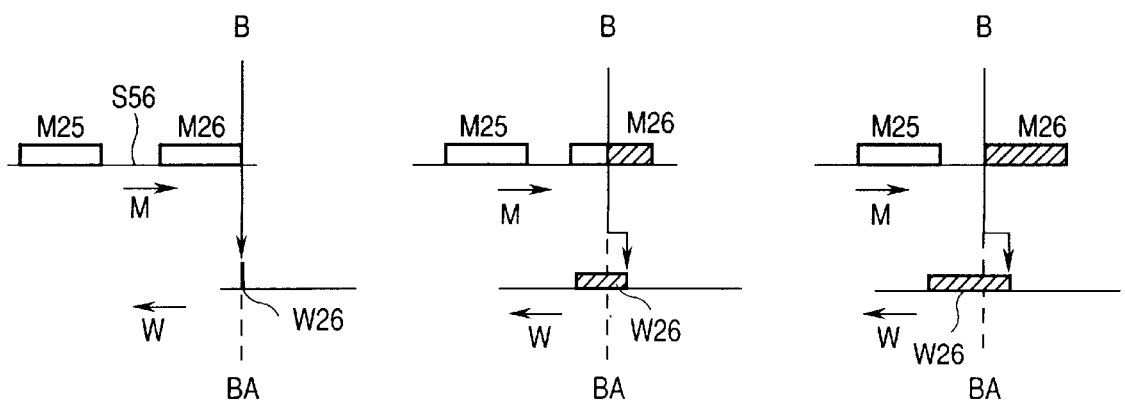
FIGS. 21A to 21E are illustrations showing states in which divided patterns on a mask of the fourth embodiment of the present invention are connected on a wafer.

FIG. 21A shows a moment of a start of exposure at which the divided pattern M26 is exposed onto the wafer 158.

FIG. 21B shows a state in which the divided pattern M26 is exposed onto a wafer 355 as divided pattern W26 to be transferred and a light-beam deflection value above a wafer 358 increases as time passes from a start to an end of exposure of the same divided pattern M26.

In the case of this embodiment, the electron beam 360 is deflected in the opposite direction to the continuous moving direction of the wafer 358 by the wafer deflector 365 above the wafer 258 as shown in FIG. 20.

FIG. 21C shows a moment at an end of exposure of the divided pattern M26. Immediately after FIG. 21C in which the exposure of the divided pattern M26 ends, light-beam deflection values on the mask 355 and wafer 358 are returned to zero to wait for the start of exposure of the next divided pattern M25.

Figures 21D, 21E:
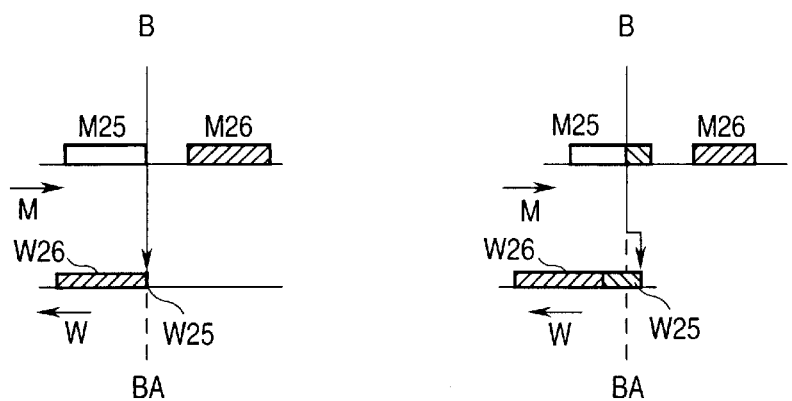

FIG. 21D shows a moment at which exposure of the next divided pattern is started. Because the light beam is deflected by SW in the direction opposite to the direction of the stage in FIG. 21C, light-beam blanking and resetting of an output to the wafer deflector 365 are executed until the width of the exposed divided pattern W26 of a pattern to be transferred on the wafer 358 moves to the position in FIG. 21D serving as the start position of exposure of the next divided pattern.

FIG. 21E shows a state in which the next divided pattern M25 is connected to the divided pattern W26 of a pattern to be transferred already exposed as the divided pattern W25 of a pattern to be transferred on a wafer.

Figure 22:
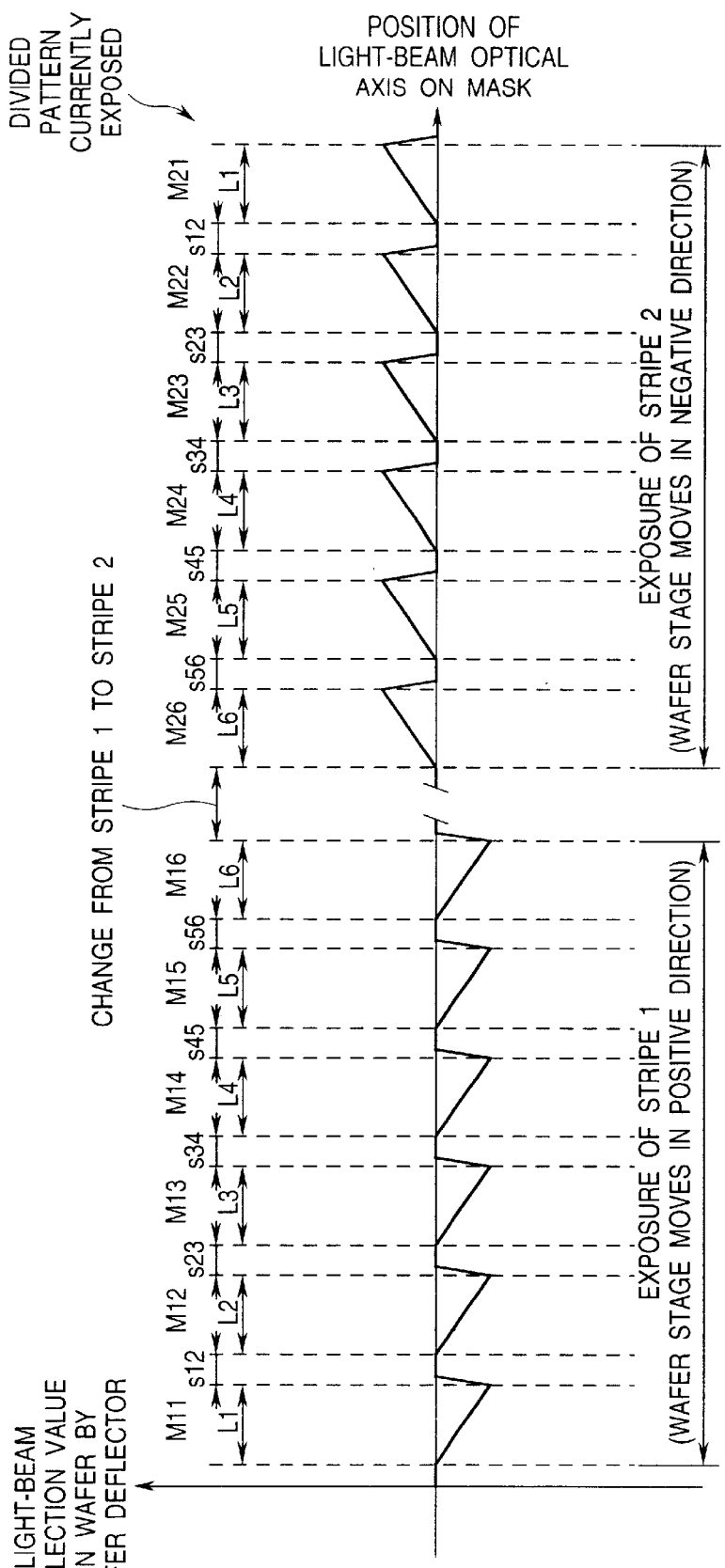
FIG. 22 is an illustration showing the relation between a light-beam deflection value by a wafer deflector of the fourth embodiment of the present invention and a position of a beam optical axis on a mask.

FIG. 22 shows a timing diagram of light-beam deflection values by the mask deflector 266 and wafer deflector 365 in the above case. In the case of this embodiment, because a light-beam deflection value is reset to zero every divided pattern similarly to the cases of the second and third embodiments, no light-beam deflection value is accumulated.

Figure 23A:
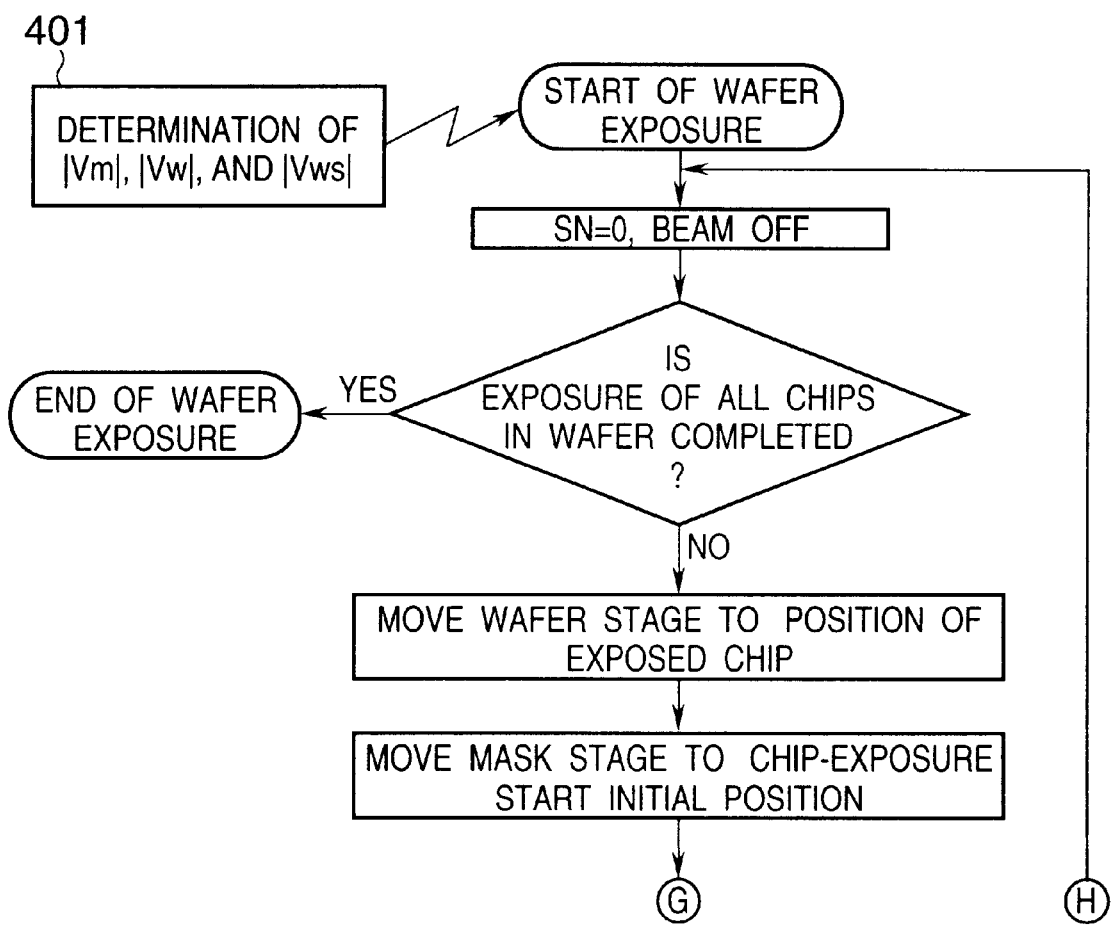
FIGS. 23A and 23B are flow charts for wafer exposure of the fourth embodiment of the present invention.
Figure 23B:
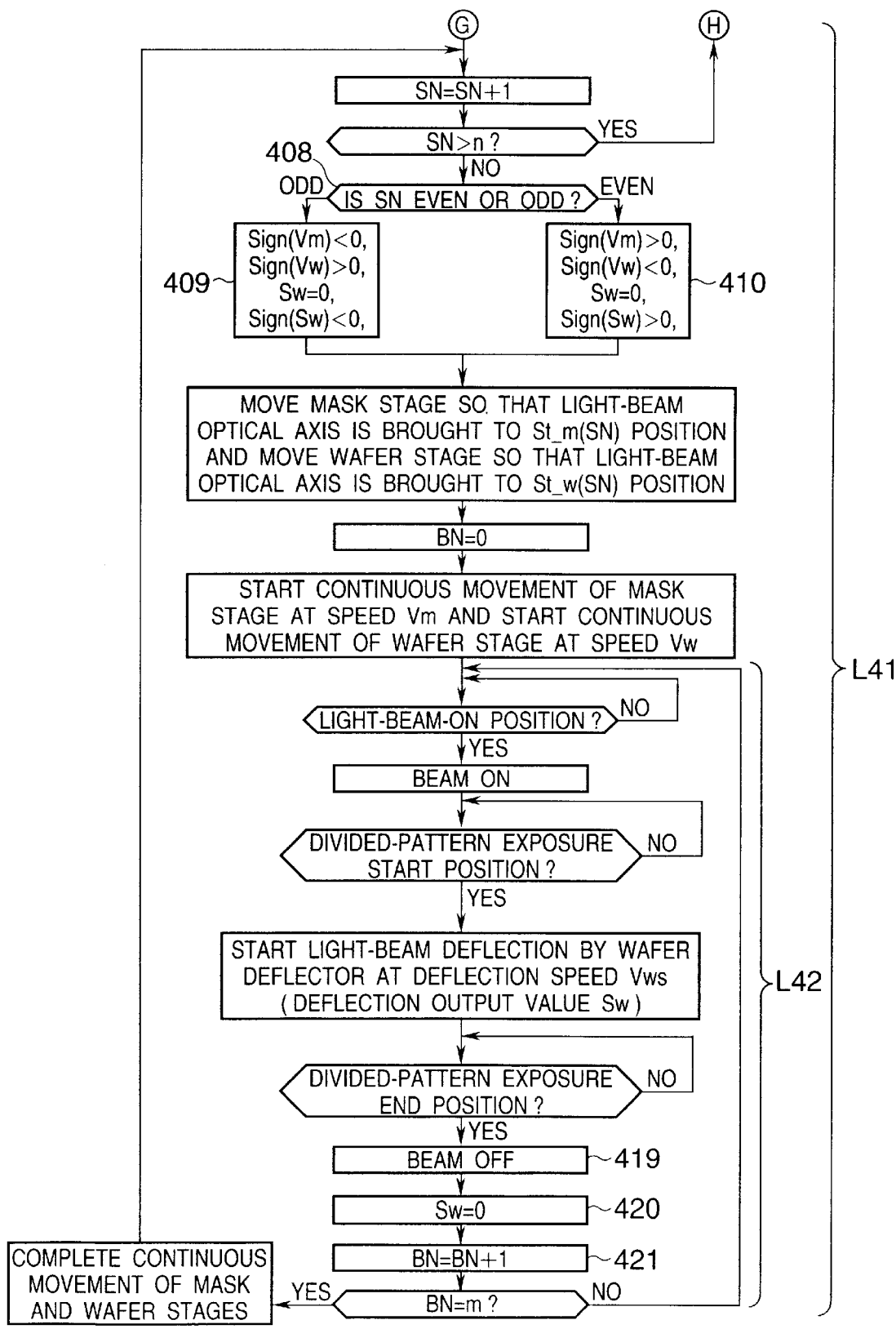

FIGS. 23A and 23B show flow charts for wafer exposure of the fourth embodiment.

Though the flow chart for wafer exposure of this embodiment is basically almost the same as the flow chart of the first embodiment shown in FIGS. 6A and 6B, both flow charts are different from each other in the following points.

First, in a step corresponding to step 101 in FIGS. 6A and 6B, a light-beam deflection speed |Vws| is determined above the wafer 358 by the wafer deflector 365 instead of an absolute value |ΔS| of a light-beam deflection value (step 401).

Moreover, in the case of the first embodiment, it is judged in step 108 whether a stripe number is even or odd. Then, when the stripe number is odd, a deflective direction of the wafer deflector 15 is set to the positive direction of the X-axis in step 109. When the stripe number is even, the deflective direction is set to the negative direction of the X-axis in step 110. In the case of this embodiment, however, it is judged whether a stripe number is even or odd (step 408). Then, when the stripe number is odd, a deflective direction of the wafer deflector 365 is set to the negative direction (step 409). When the stripe number is even, the deflective direction is set to the positive direction (step 410) and the wafer deflector 15 is deflected in the opposite direction to the case of the first embodiment.

Furthermore, in the case of the first embodiment, step 123 for resetting the light-beam deflection value Sw of the wafer deflector 15 to zero is executed after an end of the continuous movement of the mask stage 6 and wafer stage 9 getting out of the loop L2 because it is judged that all of m divided patterns on one stripe are exposed in step 120 (step 122). In the case of this embodiment, however, all of m divided patterns present on a certain stripe are exposed and the light-beam deflection value Sw of the wafer deflector 36 is reset in the loop L42 showing a loop for completing the exposure for one stripe (step 42). Thus, because a light-beam deflection value is reset whenever exposure of a divided pattern is completed, the deflection value becomes serrated when a deflection speed is constant and it is not accumulated as shown in FIG. 22.

In the case of this embodiment, because Vms among the variables described for the second embodiment is equal to 0, four unknowns Vm, Vw, Vws, and ts are determined in accordance with four expressions (3) to (6) in which Vms is set to 0 when eight variables Wmb, M, Wbw, I, Lby, S, Lp, and Ls are given. This is a typical example for determining control variables. In this case, four variables Vm, Vw, Vws, and ts are assuredly determined, but differently from the case of the second embodiment.

Table 3 shows numerical values of this embodiment thus obtained.

TABLE 3

| | Wafer side | | | Mask side | Deflection time |
|---|---|---|---|---|---|
| I [uA] | Vw [mm/s] | Vws [mm/s] | Deflection distance [mm] | Vm [mm/s] | ts [ms] |
| 3 | −25.6 | 7.7 | 0.6 | 133.3 | 78 |
| 5 | −42.7 | 12.8 | 0.6 | 222.2 | 47 |
| 8 | −68.4 | 20.5 | 0.6 | 355.6 | 29 |

As for the above variables, M is equal to 4, Wbw is equal to 0.1 [mm], Lby is equal to 3 [mm], Lp is equal to 10 [mm], Ls is equal to 3 [mm], and S is equal to 3 [uC/cm$^2$].

In the case of this embodiment, a system is simplified because a mask is not deflected and thus, the system is easily controlled.

Moreover, in the case of this embodiment, it is not always necessary to turn on/off a light beam for every divided pattern. However, it is preferable to turn on/off a light beam for every divided pattern in order to prevent a mask from being excessively heated and to minimize thermal strain.

Furthermore, a shape of a light beam is described as a rectangle. However, the light beam can be also applied to the case of a circular-arc beam improving throughput similarly to the case of the first embodiment.

As described above, in the case of this embodiment, because the electron beam 360 to be applied to the mask 355 is not deflected, it is possible to obtain a desired pattern by a simple configuration without lowering a pattern connection accuracy similarly to the cases of the first and third embodiments.

Figure 24:
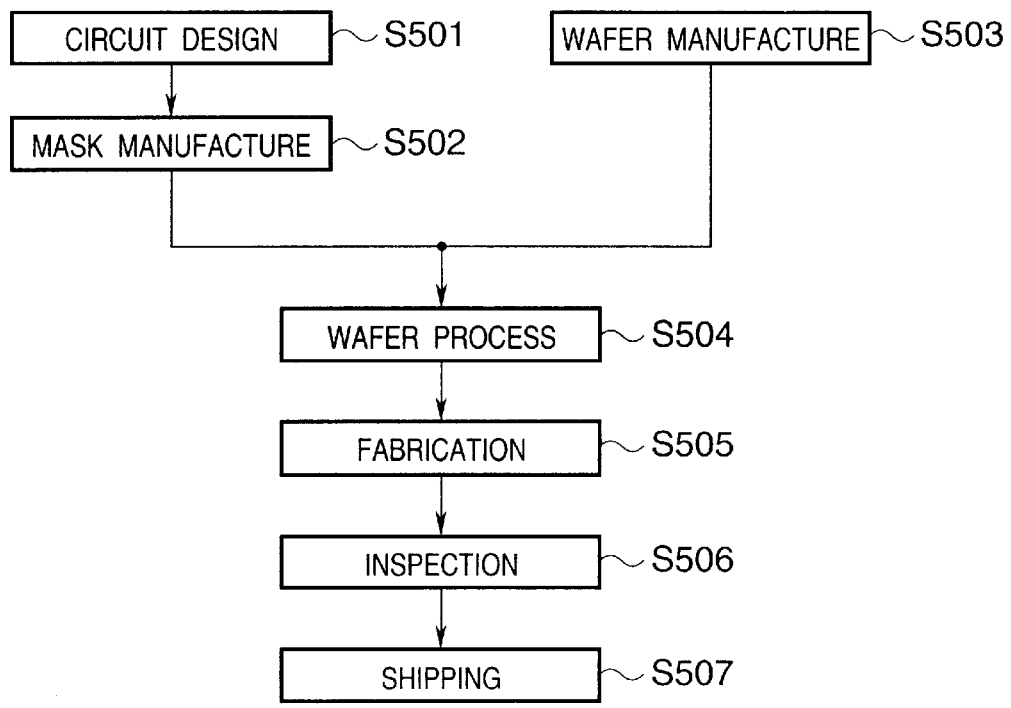
FIG. 24 is a flow chart showing a device manufacturing process.

An embodiment of a semiconductor-device fabrication method using the above aligner is described below. FIG. 24 shows a manufacturing flow of a semiconductor device (a semiconductor chip such as an IC or LSI or a liquid-crystal panel or CCD). In step 501 (circuit design), circuits of a semiconductor device are designed. In step 502 (mask fabrication), a mask on which a designed circuit pattern is formed is fabricated.

In step 503 (wafer manufacture) a wafer is manufactured by using a material such as silicon. Step 504 (wafer process) is referred to as pre-process in which a real circuit is formed on a wafer through lithography by using the above prepared mask and wafer. The next step 505 (fabrication) is referred to as a post-process for forming a semiconductor chip by using the wafer manufactured in step 504, which includes an assembly process (dicing and bonding) and a packaging process (chip sealing).

In step 506 (inspection), inspections such as an operation confirmation test and a durability test of the semiconductor device fabricated in step 505 are performed. A semiconductor device is completed after passing through these processes and shipped (step 507).

Figure 25:
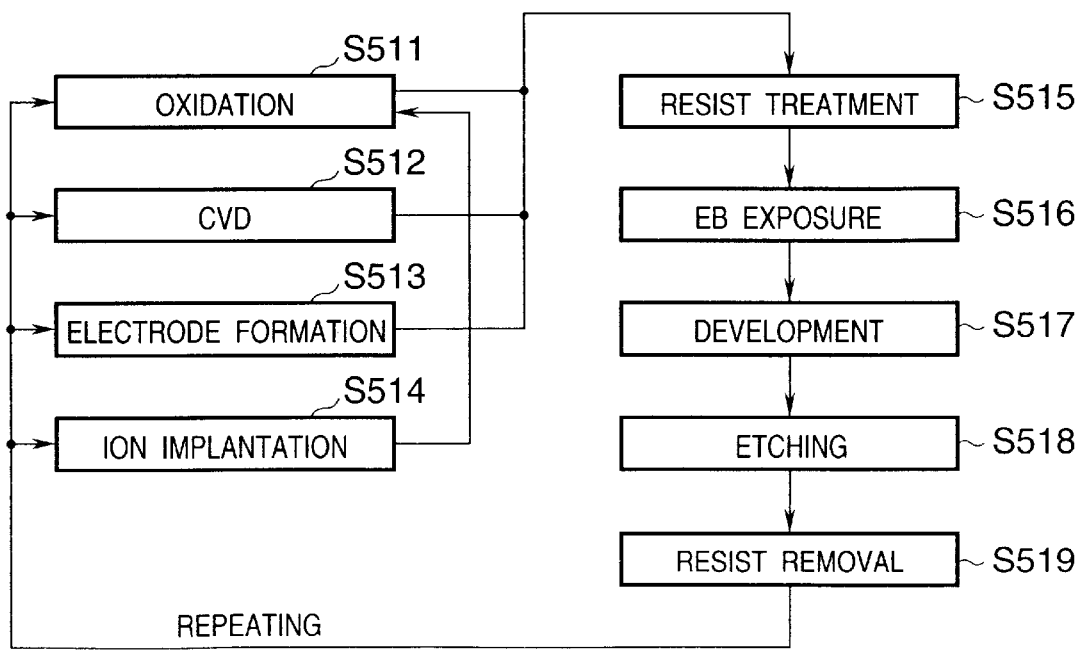
FIG. 25 is a flow chart showing details of the wafer process shown in FIG. 24.
Figure 26A:
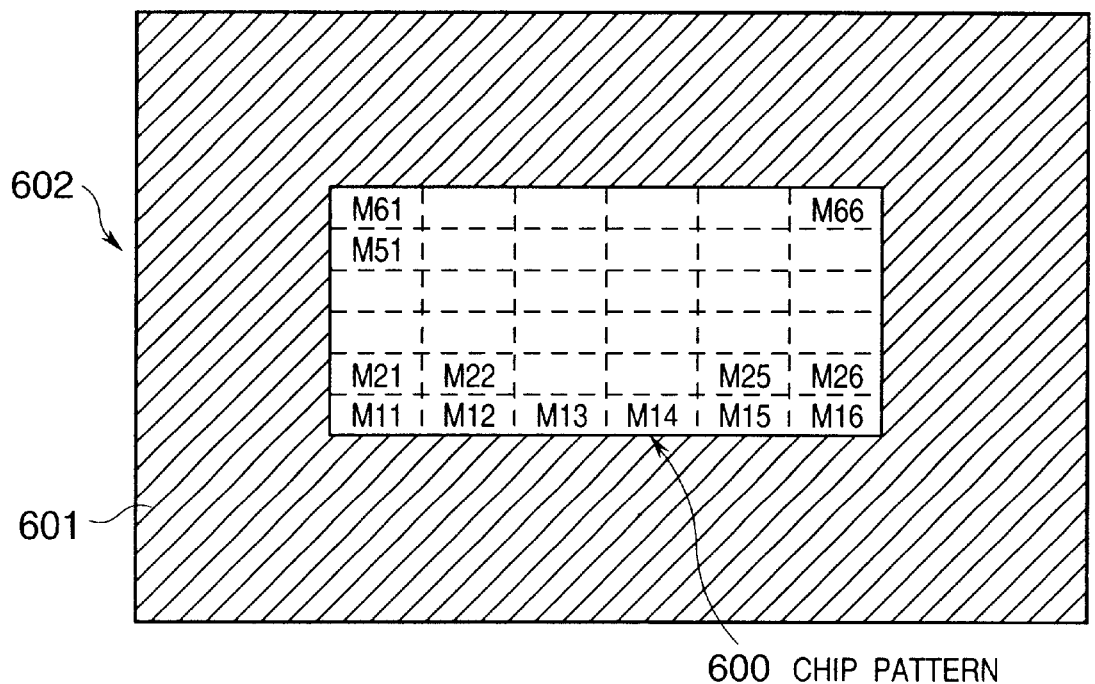
FIGS. 26A and 26B are illustrations about a conventional mask having divided patterns.
Figure 26B:
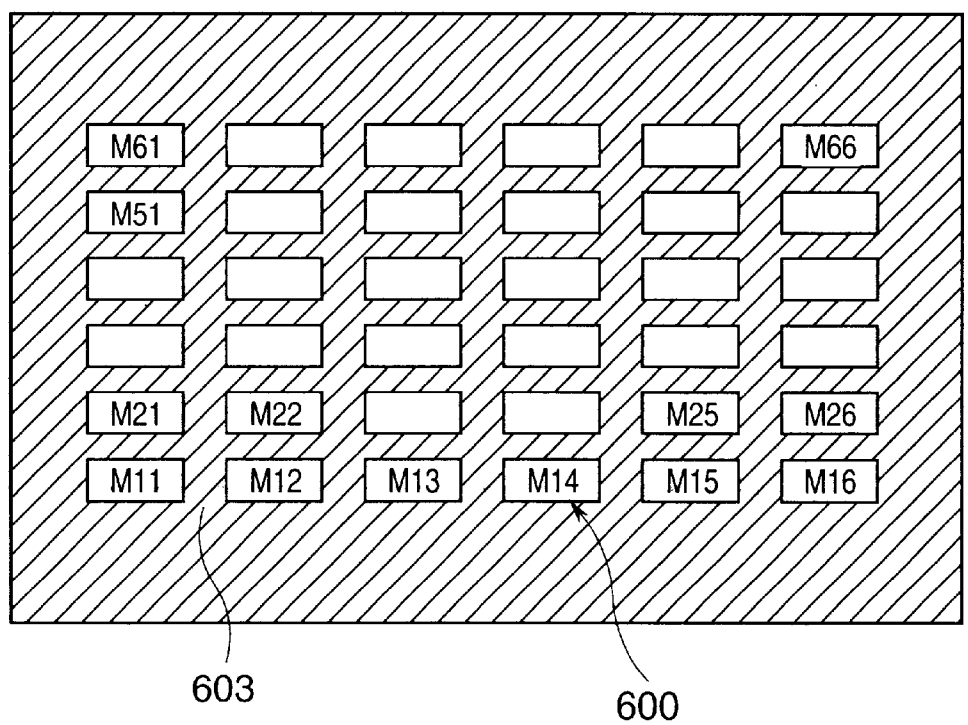
Figure 27A:
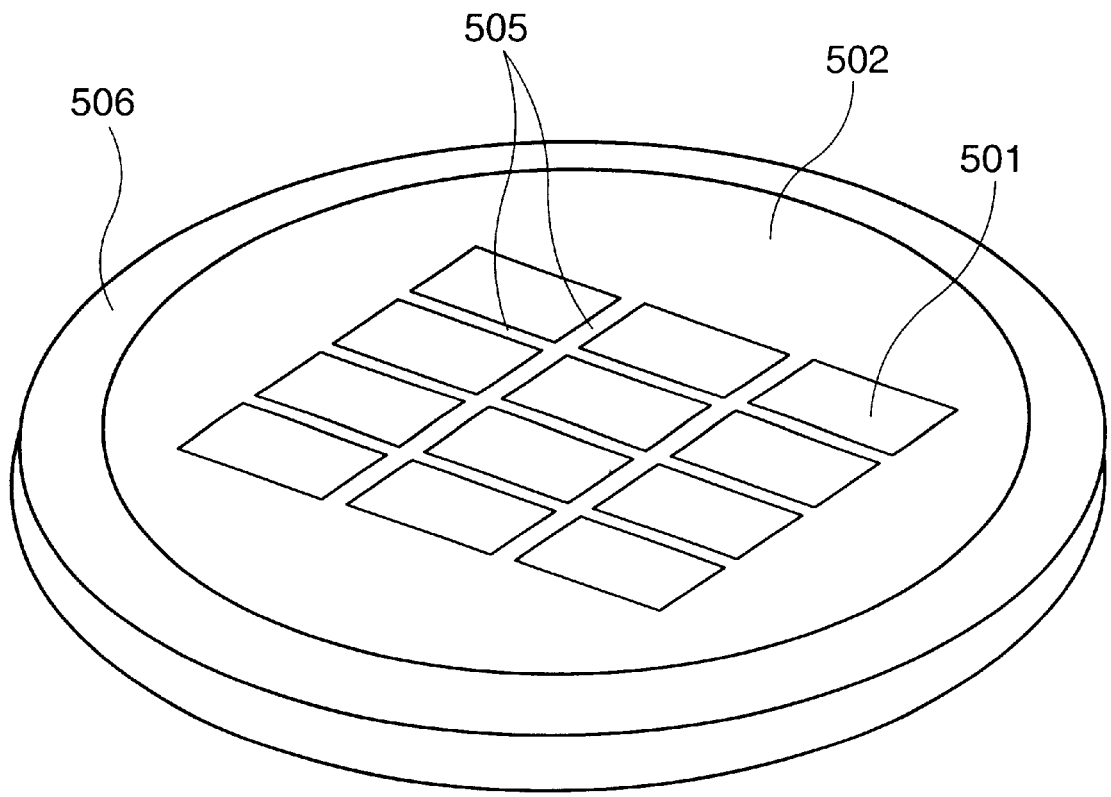
FIGS. 27A and 27B are illustrations showing a conventional electron-beam mask.
Figure 27B:
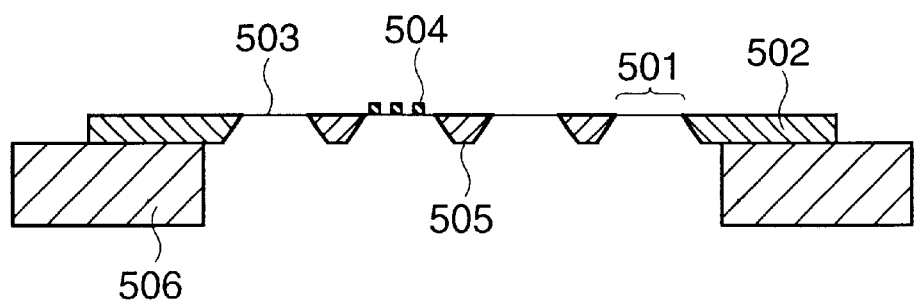
Figure 28:
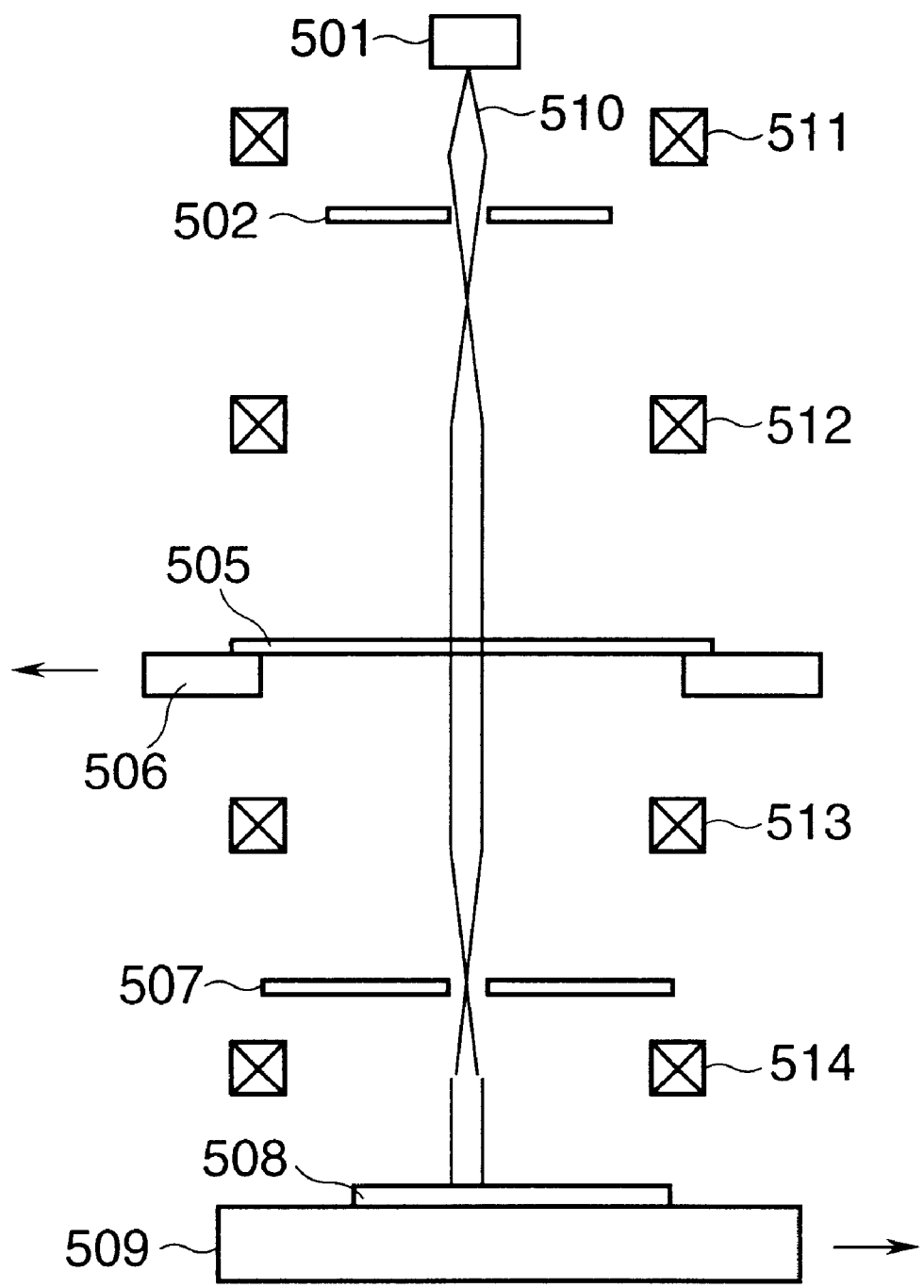
FIG. 28 is a schematic block diagram of a conventional mask-pattern transfer apparatus.
Figure 29:
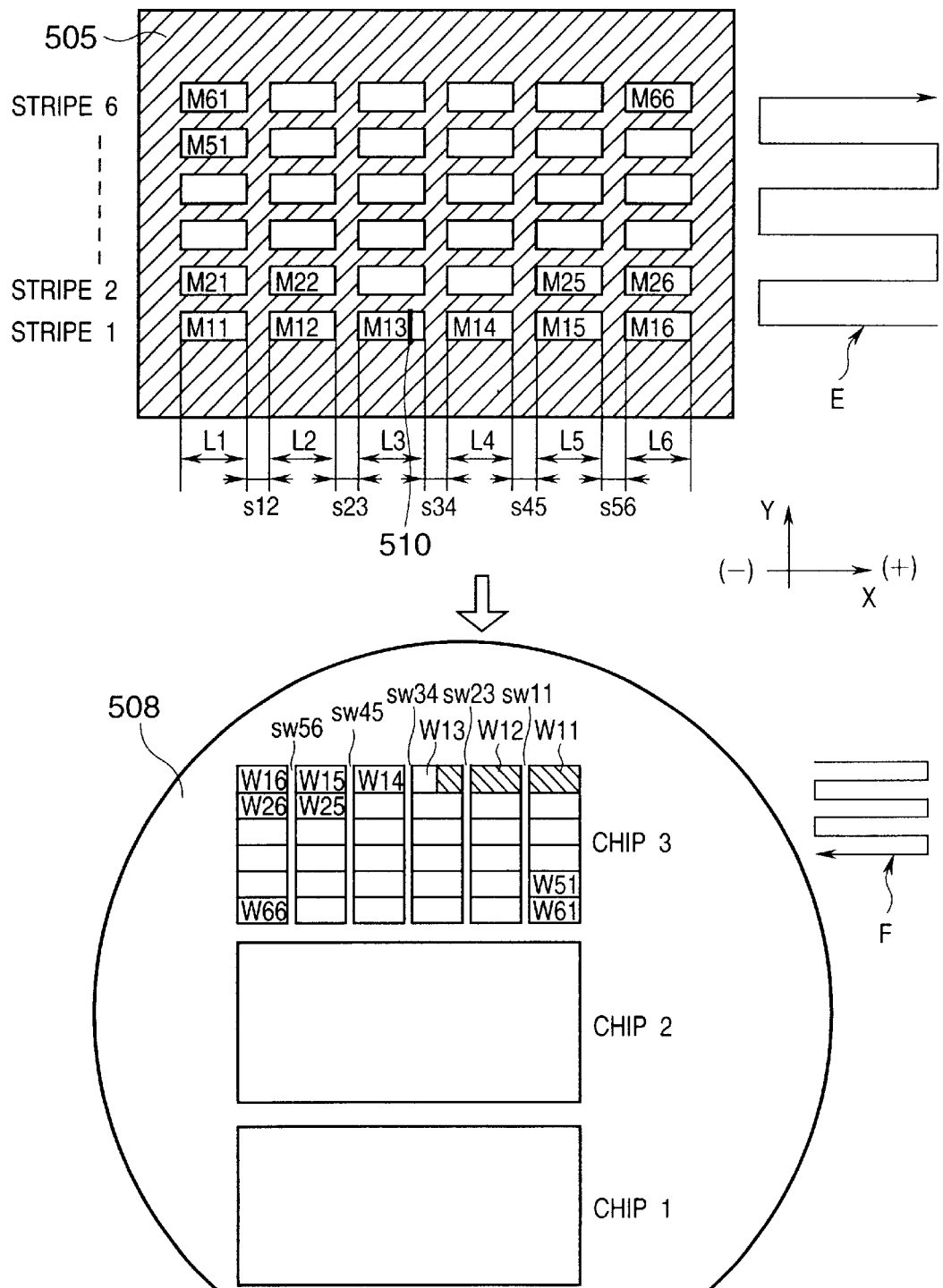
FIG. 29 is an illustration showing a conventional arrangement state of divided patterns on a mask and a conventional transfer state of the divided patterns to a wafer by an electron beam.

FIG. 25 shows a detailed flow of the above wafer process. In step 511 (oxidation), the surface of a wafer is oxidized. In step 512 (CVD), an insulating film is formed on the surface of the wafer.

In step 513 (electrode formation), an electrode is formed on the wafer through vacuum deposition. In step 514 (ion implantation), ions are implanted into the wafer. In step 515 (resist treatment), a photosensitive material is applied to the wafer. In step 516 (exposure), the circuit pattern of the mask is printed and exposed on the wafer by the above aligner.

In step 517 (development), the exposed wafer is developed. In step 518 (etching), portions other than the developed resist image are removed. In step 519 (resist removal), unnecessary resist after etching is removed. By repeating these steps, many circuit patterns are superimposed on the wafer.

By using the fabrication method of this embodiment, it is possible to easily fabricate a semiconductor device of a high integration degree whose fabrication has been difficult so far.

As described above, according to a mask pattern transfer method of the present invention, it is possible to eliminate vibrations produced due to acceleration or deceleration of a mask or an object or improve a low mechanical-control response speed because the mask and the object continuously move relatively to each other. Moreover, because deflection of a charged beam passing through a divided pattern is set, it is possible to obtain a desired pattern by setting deflection for connecting divided patterns on a mask arranged at the both sides of a beam on an object and thereby, connecting the divided patterns on the object.

Moreover, by setting a deflective direction to a direction the same as a moving direction of a mask, it is possible to decrease a moving speed of the mask and decelerate the accuracy deterioration due to vibrations. Therefore, the above setting is effective in laying stress on accuracy.

Furthermore, by setting a deflective direction to a direction opposite to a moving direction of a mask, it is possible to increase a moving speed of the mask and improve throughput. Therefore, the above setting is effective in laying stress on throughput.

Thus, it is possible to improve throughput without lowering a pattern connection accuracy.

The present invention is not limited to the above embodiments and various changes and modifications can be made within the spirit and scope of the present invention. Therefore, to apprise the public of the scope of the present invention, the following claims are made.

What is claimed is:

1. A mask pattern transfer apparatus for transferring a desired pattern onto an object with a charged beam by using a mask on which divided patterns obtained by dividing the desired pattern are arranged, the apparatus comprising:

a lens which directs the charged beam from a beam generator toward the mask;

a movable mask stage on which the mask is mounted;

a movable object stage on which the object is mounted;

a first deflector which deflects the charged beam passed through the mask; and a controller for moving the mask stage and the object stage from a start of exposure of a first exposure area in which a first divided pattern is exposed up to an end of exposure of a second exposure area in which a second divided pattern is exposed, and after exposing the first exposure area, making the first deflector deflect the charged beam in a moving direction of the object or in a direction opposite to the moving direction so as to connect the second exposure area with the first exposure area, wherein a width of the moving direction of the charged beam which irradiates the mask is smaller than a width of the moving direction of each of the divided patterns, the charged beam scans each of the divided patterns, and the patterns are transferred to the object.

2. The mask pattern transfer apparatus according to claim 1, wherein the controller deflects the charged beam by the first deflector while the first exposure area is exposed.

3. The mask pattern transfer apparatus according to claim 1, wherein the controller deflects the charged beam in a direction opposite to a relative moving direction of the object by the first deflector while the first exposure area is exposed.

4. The mask pattern transfer apparatus according to claim 1, further comprising a second deflector for deflecting the charged beam, wherein the controller deflects a charged beam emitted from the beam generator in a direction opposite to a relative moving direction of the mask by the second deflector while the first exposure area is exposed.

5. The mask pattern transfer apparatus according to claim 1, further comprising a second deflector for deflecting the charged beam, wherein the controller deflects a charged beam emitted from the beam generator in a direction the same as a relative moving direction of the mask by the second deflector while the first exposure area is exposed.

6. The mask pattern transfer apparatus according to claim 1, wherein the controller sets a deflection value for the first deflector to a value corresponding to a beam width between divided patterns exposed on the object.

7. The mask pattern transfer apparatus according to claim 6, wherein a deflection value of a charged beam passing through the divided patterns is stepwise accumulated when the divided patterns are successively exposed on the same stripe.

8. The mask pattern transfer apparatus according to claim 1, wherein deflection of a charged beam to be applied to the mask by the second deflector and deflection of a charged beam passing through the divided patterns by the first deflector are substantially simultaneously started and completed for each of the divided patterns.

9. The mask pattern transfer apparatus according to claim 1, wherein a deflection value of a charged beam to be applied to the mask by the second deflector and a deflection value of a charged beam passing through the divided patterns by the first deflector are not accumulated when the divided patterns arranged in a direction the same as a relative moving direction are exposed.

10. The mask pattern transfer apparatus according to claim 1, wherein a moving speed in a relative moving direction of the mask stage, a moving speed in a relative moving direction of an object stage, a deflection speed of deflection of a charged beam to be applied to a mask by the second deflector, and a deflection speed of deflection of a charged beam passing through the divided patterns by the first deflector are controlled by the controller.

11. The mask pattern transfer apparatus according to claim 10, wherein a moving speed of the mask, a moving speed of the object, a deflection speed of a charged beam to be applied to the mask, and a deflection speed of a charged beam passing through the divided patterns are substantially equal to values meeting the following expressions (1) to (5):

$$(-Vms+Vm) \cdot ts = Lp + Wbm \quad (1)$$

$$(Lp+Wbm)/M = (-Vw+Vws) \cdot ts \quad (2)$$

$$(Ls-Wbm-Vms \cdot ts)/Vm = (ts \cdot Vws - Wbw)/(-Vw) \quad (3)$$

$$-Vw+Vws = I/(Lby \cdot S) \quad (4)$$

$$Wbm = M \cdot Wbw \quad (5)$$

where
Vm: moving speed in relative moving direction of mask,
Vms: deflection speed of charged beam to be applied to mask,
Vw: moving speed in relative moving direction of object,
Vws: deflection speed of charged beam passing through divided patterns,
Wbm: light-beam width on mask,
1/M: optical magnification,
ts: time for charge beam to be deflected,
Lp: length of divided pattern on mask,
Ls: beam width between divided patterns on mask,
S: sensitivity of resist used,
I: current value of charged beam passing through divided patterns, and
Lby: length of charged beam on object.

12. The mask pattern transfer apparatus according to claim 1, wherein a deflection value of a charged beam passing through the divided patterns is not accumulated.

13. The mask pattern transfer apparatus according to claim 1, wherein a moving speed in a relative moving direction of the mask stage, a moving speed in a relative moving direction of an object stage, a deflection speed of deflection of a charged beam to be applied to a mask by the second deflector, and a deflection speed of deflection of a charged beam passing through the divided patterns by the first deflector are controlled by the controller.

14. The mask pattern transfer apparatus according to claim 13, wherein a moving speed of the mask, a moving speed of the object, and a deflection speed of a charged beam passing through the divided patterns are substantially equal to values meeting the following expressions (6) to (10):

$$-Vm \cdot ts = Lp + Wbm \quad (6)$$

$$(Lp+Wbm)/M = (-Vw+Vws) \cdot ts \quad (7)$$

$$(Ls-Wbm)/Vm = (ts \cdot Vws - Wbw)/(-Vw) \quad (8)$$

$$-Vw+Vws = I/(Lby \cdot S) \quad (9)$$

$$Wbm = M \cdot Wbw \quad (10)$$

where
Vm: moving speed in relative moving direction of mask,
Vw: moving speed in relative moving direction of object,
Vws: deflection speed of charged beam passing through divided patterns,
Wbm: light-beam width on mask,
1/M: optical magnification,
ts: time for charge beam to be deflected,
Lp: length of divided pattern on mask,
Ls: beam width between divided patterns on mask,
S: sensitivity of resist used,
I: current value of charged beam passing through divided patterns, and
Lby: length of charged beam on object.

15. The mask pattern transfer apparatus according to claim 1, wherein the charged beam is deflected at a constant speed.

16. The mask pattern transfer apparatus according to claim 1, wherein a relative moving direction of the mask stage while the divided patterns arranged in a direction the same as a relative moving direction are exposed and a relative moving direction of the object stage are opposite to a direction of a stripe exposed immediately before.

17. The mask pattern transfer apparatus according to claim 1, wherein the charged beam is turned on whenever exposure of each of the divided patterns is started and turned off whenever exposure of each of the divided patterns is completed.

18. A device manufacturing method including:
   a step of transferring a mask pattern by using the mask pattern transfer apparatus of claim 1.

* * * * *

UNITED STATES PATENT AND TRADEMARK OFFICE
CERTIFICATE OF CORRECTION

PATENT NO. : 6,559,463 B2
DATED : May 6, 2003
INVENTOR(S) : Haruhito Ono et al.

It is certified that error appears in the above-identified patent and that said Letters Patent is hereby corrected as shown below:

Column 2,
Line 3, "0.15 µgm" should read -- 0.15 µm --.
Line 34, "each" should read -- with each --.
Line 35, "Fat" should read -- F at --.
Line 54, "30B)" should read -- 30B). --.

Column 6,
Line 26, "5makes" should read -- 5 makes --.

Column 14,
Line 2, "ligth-beam" should read -- light-beam --.
Line 3, "ligth" should read -- light --.

Signed and Sealed this

Ninth Day of December, 2003

JAMES E. ROGAN
*Director of the United States Patent and Trademark Office*